(12) United States Patent
Chien et al.

(10) Patent No.: US 7,582,524 B2
(45) Date of Patent: Sep. 1, 2009

(54) METHOD FOR PREPARING A MEMORY STRUCTURE

(75) Inventors: Jung Wu Chien, Hsinchu (TW); Chia Shun Hsiao, Hsinchu (TW)

(73) Assignee: Promos Technologies Inc., Hsinchu (TW)

( * ) Notice: Subject to any disclaimer, the term of this patent is extended or adjusted under 35 U.S.C. 154(b) by 235 days.

(21) Appl. No.: 11/529,502

(22) Filed: Sep. 29, 2006

(65) Prior Publication Data

US 2008/0050878 A1 Feb. 28, 2008

(30) Foreign Application Priority Data

Aug. 23, 2006 (TW) ............... 95130947 A

(51) Int. Cl.
*H01L 21/8242* (2006.01)
(52) U.S. Cl. ............... 438/239; 257/E27.084
(58) Field of Classification Search ......... 438/278, 438/239, 618, 253, 612, 299, 637; 258/68–71, 258/296–309, 905–908, E27.084–E27.097, 258/E27.075
See application file for complete search history.

(56) References Cited

U.S. PATENT DOCUMENTS 6,403,996 B1 * 6/2002 Lee ............... 257/256

2002/0182816 A1 * 12/2002 Wu et al. ............... 438/345

OTHER PUBLICATIONS

C. Cho et al., "A 6F² DRAM Technology in 60nm era for Gigabit Densities," 2005 Symposium on VLSI Technology Digest of Technical Papers, pp. 36-37.
F. Fishburn et al., "A 78nm 6F² DRAM Technology for Multigigabit Densities," 2004 Symposium on VLSI Technology Digest of Technical Papers, pp. 28-29.

* cited by examiner

*Primary Examiner*—Brook Kebede
*Assistant Examiner*—Tony Tran
(74) *Attorney, Agent, or Firm*—Oliff & Berridge, PLC

(57) ABSTRACT

A method for preparing a memory structure comprises the steps of forming a plurality of line-shaped blocks on a dielectric structure of a substrate, and forming a first etching mask exposing a sidewall of the line-shaped blocks. A portion of the line-shaped blocks is removed incorporating the first etching mask to reduce the width of the line-shaped blocks to form a second etching mask including a plurality of first blocks and second blocks arranged in an interlaced manner. Subsequently, a portion of the dielectric structure not covered by the second etching mask is removed to form a plurality of openings in the dielectric structure, and a conductive plug is formed in each of the openings. The plurality of openings includes first openings positioned between the first blocks and second openings positioned between the second blocks, and the first opening and the second opening extend to opposite sides of an active area.

16 Claims, 27 Drawing Sheets

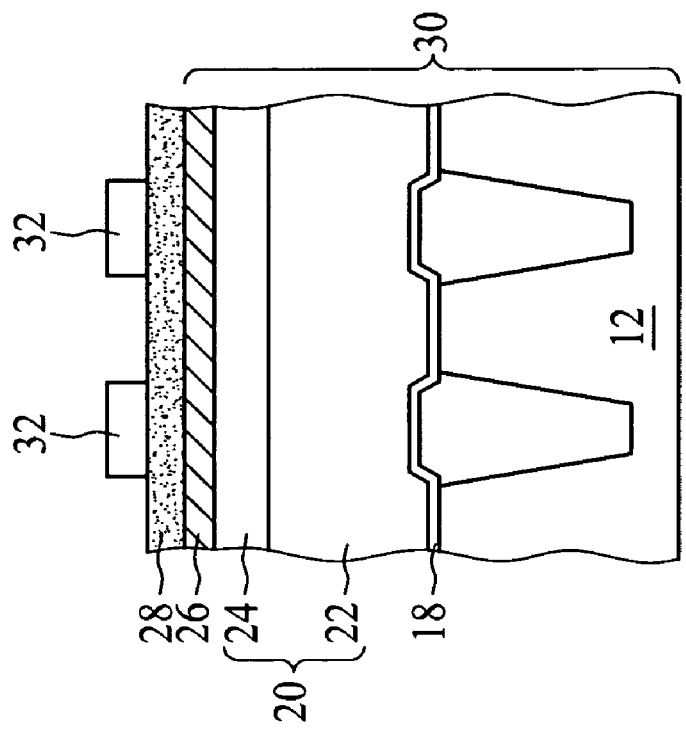
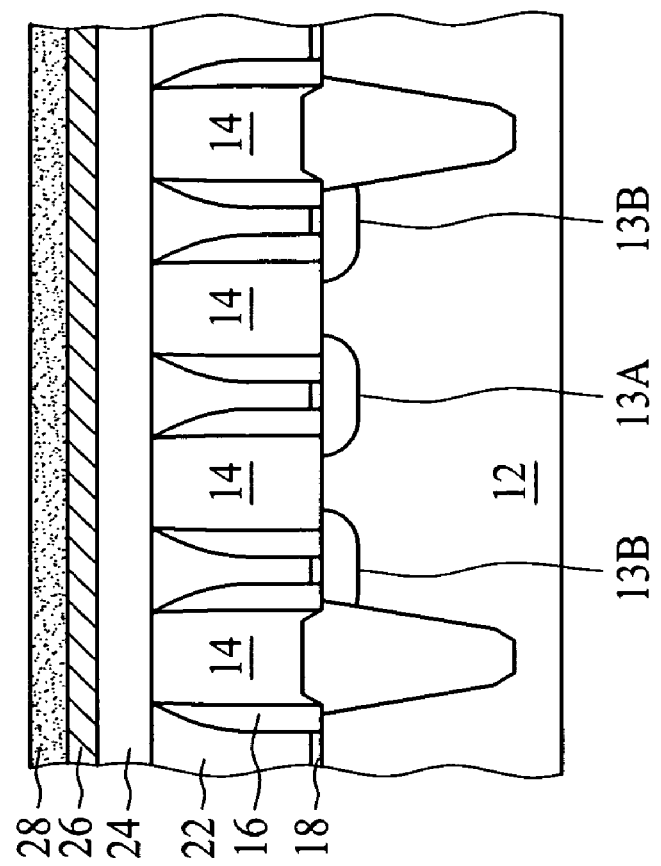
FIG. 3(a)
FIG. 3(b)

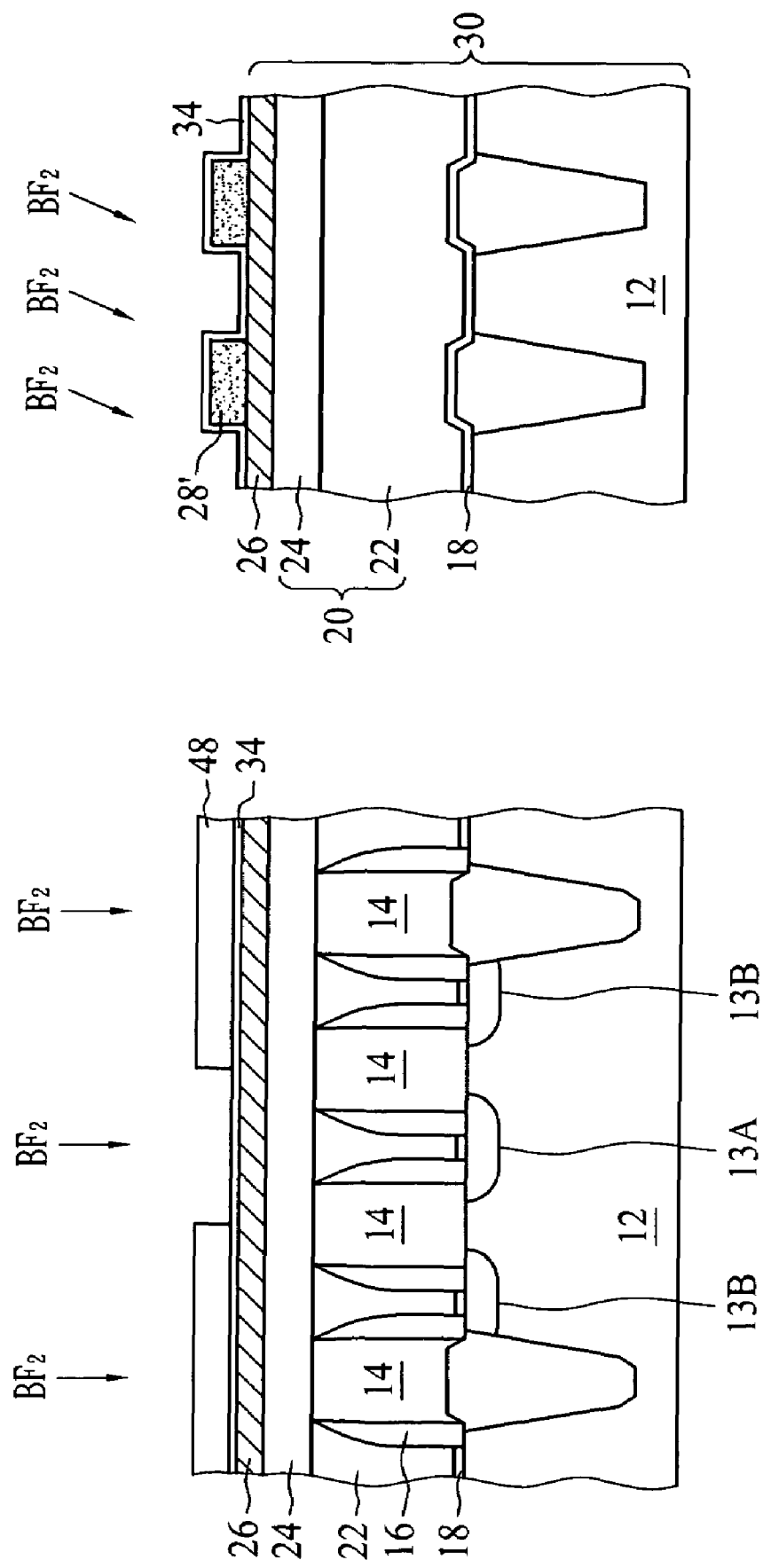

METHOD FOR PREPARING A MEMORY STRUCTURE

BACKGROUND OF THE INVENTION (A) Field of the Invention

The present invention relates to a method for preparing a memory structure, and more particularly, to a method for preparing a memory structure having conductive plugs extending to opposite sides of an active area.

(B) Description of the Related Art

Recently, the number of memory cells and the storage density of the dynamic random access memory (DRAM) has rapidly increased due to innovations in semiconductor fabrication technology. Each memory cell of the DRAM generally consists of a metal oxide semiconductor field effect transistor (MOSFET) and a capacitor on a silicon substrate, and the MOSFET includes a source terminal electrically connected to an upper storage plate of the capacitor. There are two types of capacitors: stack capacitors and deep trench capacitors. The stack capacitor is fabricated on the surface of the semiconductor substrate, while the deep trench capacitor is fabricated inside the semiconductor substrate.

FIG. 1 shows a conventional DRAM 100 disclosed by researchers employed by Samsung Electronics in 2005 *Symposium on VLSI Technology Digest of Technical Papers*. The DRAM 100 comprises a plurality of word lines 102, a plurality of bit lines 104, a plurality of tilt active areas 106, a bit line contact plug 108 positioned at the middle of the active area 106, and two capacitor contact plugs 110 positioned at two sides of the active area 106. The DRAM 100 is designed with a 6 $F^2$ memory cell, i.e., 2 F(word line)×3 F(bit line)=6 $F^2$, wherein F represents the critical dimension.

However, the preparation of the DRAM 100 requires the use of the double exposure technique for patterning the electrically isolated tile active areas 106, and the double exposure technique is still not available in the exposure machine currently used in semiconductor fabrication. In addition, the size of the capacitor contact plug 100 between two word lines 102 is 1 F, which requires an advanced lithographic technique such as the liquid immersion lithographic technique to precisely define the size and position of the capacitor plug 110.

FIG. 2 shows another conventional DRAM 120 disclosed by researchers employed by Micron Technology in 2004 *Symposium on VLSI Technology Digest of Technical Papers*. The DRAM 120 comprises a plurality of word lines 122, a plurality of tilt bit lines 124, a plurality of tilt active area 126, a bit line contact plug 128 positioned at the middle of the active area 126, and two capacitor contact plugs 130 positioned at two sides of the tilt active area 126. In comparison with the DRAM 100 having a tilt active area 106 shown in FIG. 1, the active area 126 and the bit lines 124 of the DRAM 120 are both tilted. In addition, the bit line contact plug 128 is positioned right at the intersection of the tilt active area 126 and the tilt bit line 124.

SUMMARY OF THE INVENTION

One aspect of the present invention provides a method for preparing a memory structure having conductive plugs extending to opposite sides of an active area so as to decrease precision demand on advanced lithographic techniques.

A method for preparing a memory structure according to this aspect of the present invention first forms a plurality of line-shaped patterns on a substrate having a dielectric structure and a first etching mask exposing a portion of sidewalls of the line-shaped pattern. A wet etching process is performed to remove a portion of the line-shaped pattern to decrease the width of the line-shaped patterns to form a second etching mask including a plurality of first blocks and a plurality of second blocks. Subsequently, a dry etching process is performed to remove a portion of the dielectric structure not covered by the second etching mask to form a plurality of openings in the dielectric structure and conductive plugs are then formed in the openings.

Preferably, the line-shaped pattern includes dielectric material and the wet etching process uses a buffed oxide etchant to remove a portion of the sidewalls of the line-shaped patterns to decrease the width of the line-shaped patterns. In particular, the wet etching process etches the line-shaped patterns inside a predetermined region from a first side and etches the line-shaped patterns outside the predetermined region from a second side opposite to the first side to form a plurality of first blocks and a plurality of second blocks positioned in an interlaced manner. In addition, the openings include a plurality of first openings positioned between the first blocks and a plurality of second openings positioned between the second blocks, and the first openings and the second openings extend to opposite sides of an active area.

To form the first etching mask exposing a portion of the sidewalls of the line-shaped pattern, a deposition process is performed to form a silicon-containing layer covering the line-shaped patterns, and a first implanting mask is formed to cover a portion of the silicon-containing layer in the predetermined region. A first tilt implanting process is performed to implant dopants into the silicon-containing layer outside the predetermined region to change the chemical property of a predetermined portion of the silicon-containing layer. A second implanting mask exposing the silicon-containing layer in the predetermined region is formed after the first implanting mask is removed, and a second implanting process is then performed to implant dopants into the silicon-containing layer inside the predetermined region. Subsequently, a wet etching process incorporating an etchant including ammonia is performed to remove a portion of the silicon-containing layer other than the predetermined portion to form the first etching mask. Preferably, the implanting direction of the first tilt implanting process is opposite to the implanting direction of the second tilt implanting process, the silicon-containing layer includes polysilicon, and the dopants include boron fluoride.

The conventional memory structure requires the double exposure technique and an advanced lithographic technique to define the size and the position of the capacitor contact plug, i.e., the contact hole, as the integrated circuit technique proceeds into the nanometer generation (F is smaller than 100 nanometers). In comparison, the present invention uses the etching process to extend the width of the first openings and the second openings from opposite sides of the active area, and the width of the first conductive plugs in the first openings and the second conductive plugs in the second openings extend to opposite sides of the active area such that the use of the double exposure technique and advanced lithographic techniques such as the liquid immersion lithographic technique can be postponed to the next generation.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 1:
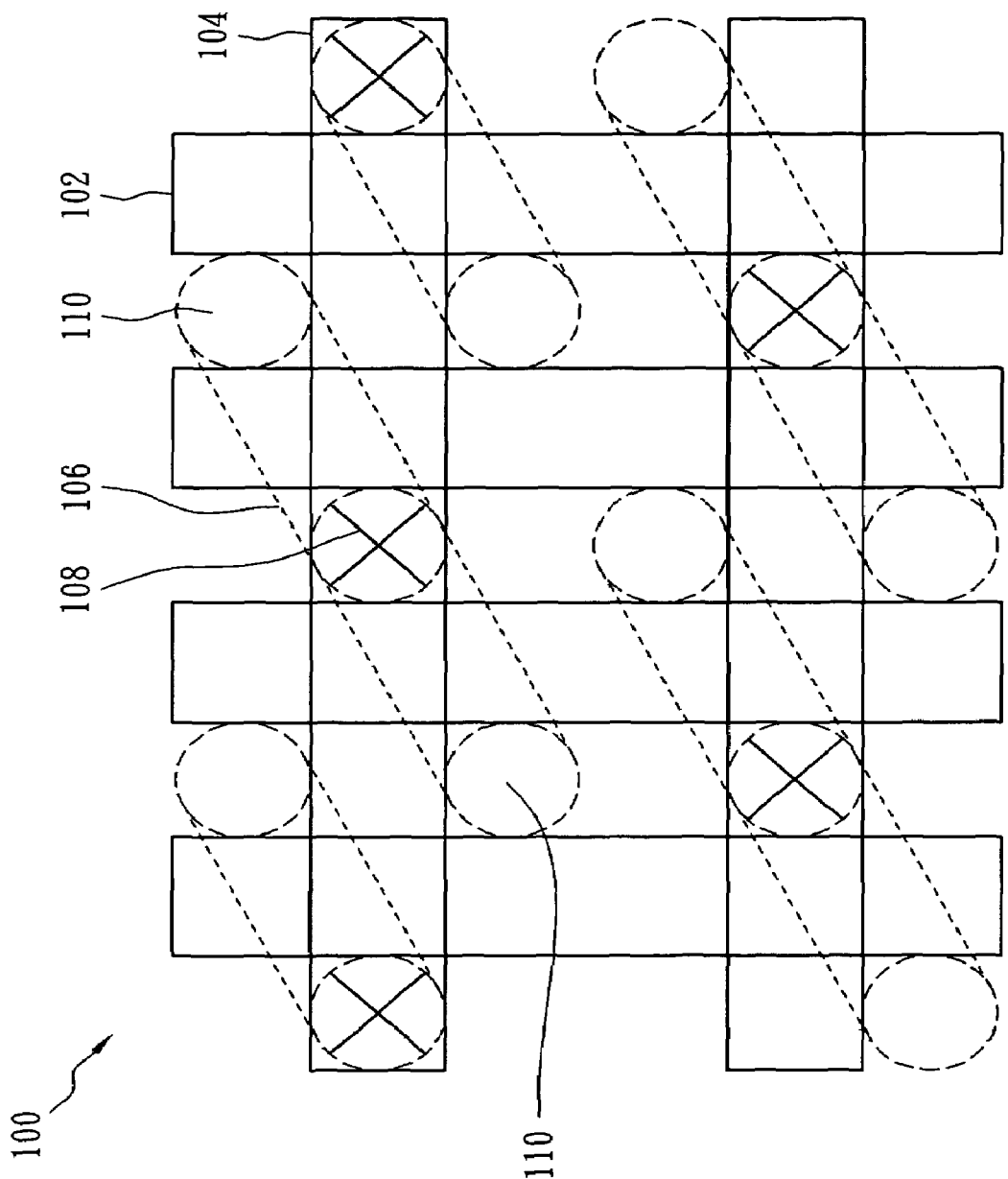
FIG. 1 shows a conventional DRAM.
Figure 2:
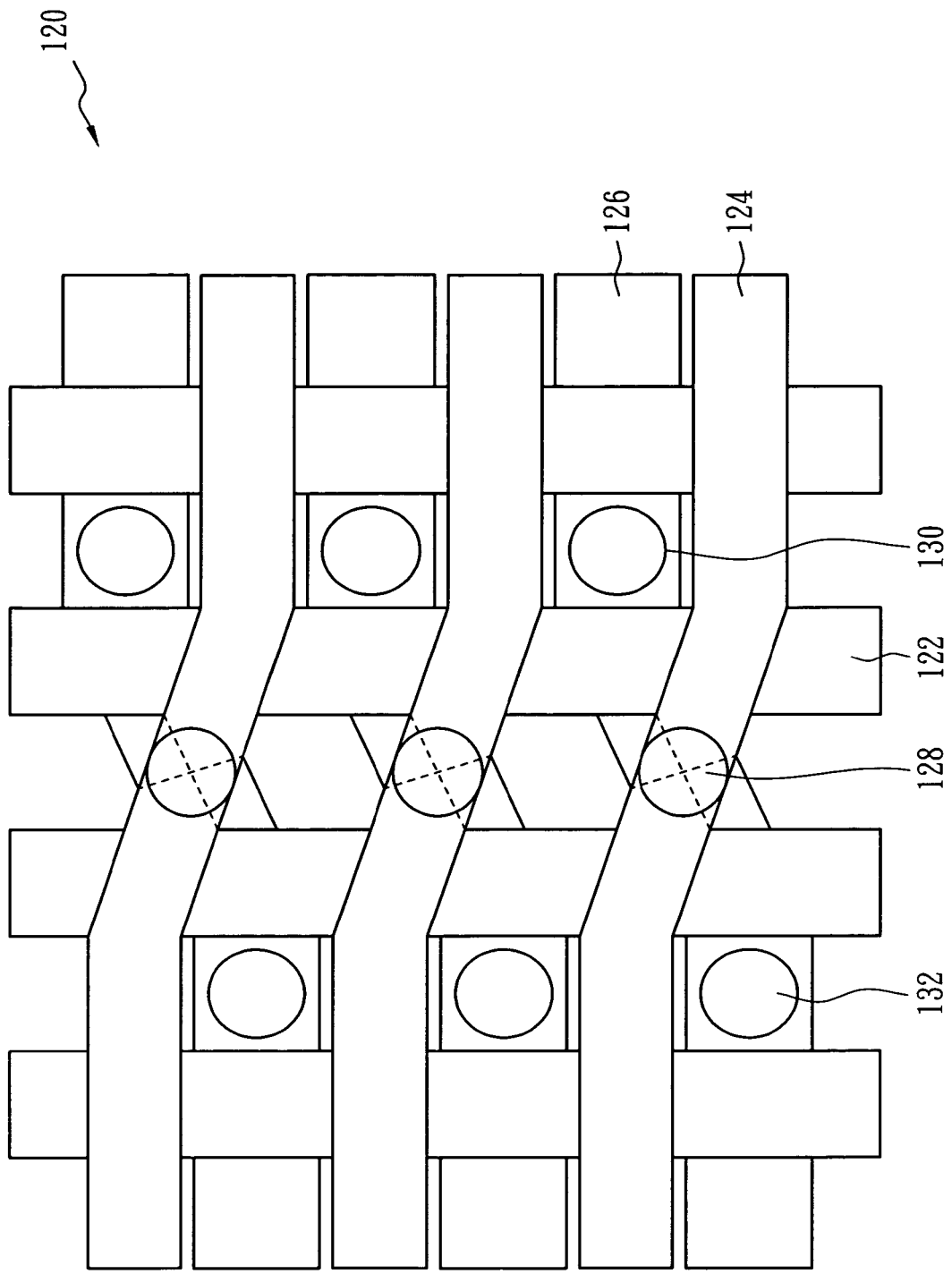
FIG. 2 shows another conventional DRAM.
Figure 3:
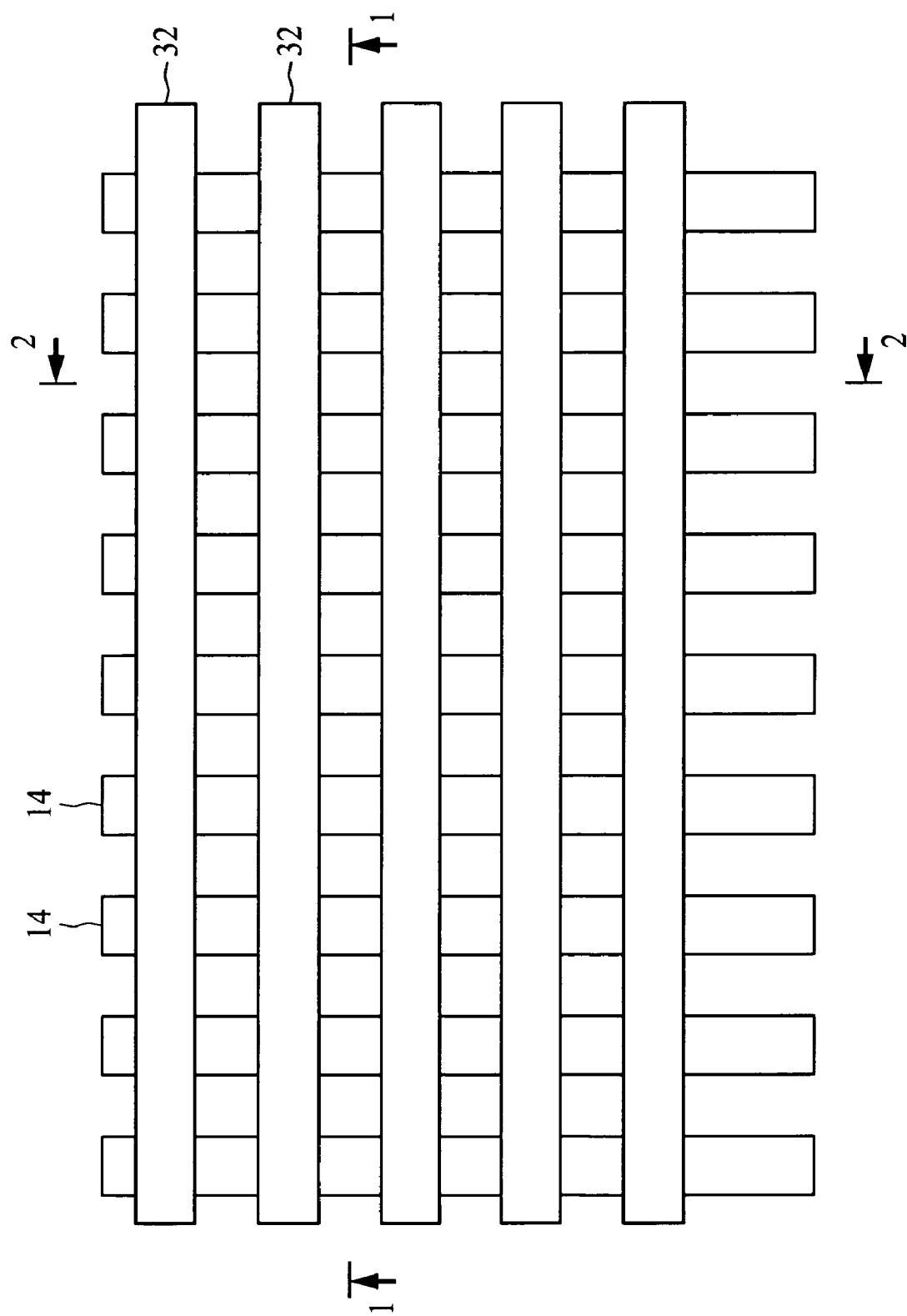
FIG. 3 to FIG. 15(b) illustrate a method for preparing a memory structure according to one embodiment of the present invention.

FIG. 3 to FIG. 15(b) illustrate a method for preparing a memory structure 10 according to one embodiment of the present invention, wherein FIG. 3(a) and FIG. 3(b) are cross-sectional diagrams along cross-sectional lines 1-1 and 2-2 in FIG. 3, respectively. First, a silicon-containing layer such as a polysilicon layer 26 is formed on a substrate 30, a dielectric layer 28 is then formed on the silicon-containing layer 26, and a line-shaped photoresist layer 32 is formed on the dielectric layer 28, wherein the dielectric layer 28 may include tetra-ethyl silicate (TEOS).

The substrate 30 comprises a semiconductor substrate 12 such as silicon substrate, a plurality of doped regions 13A and 13B positioned in the semiconductor substrate 12, a plurality of word lines 14 positioned on the semiconductor substrate 12, a silicon nitride spacer 16 covering the sidewalls of the word lines 14, a silicon nitride layer 18 covering the surface of the semiconductor substrate 12, and a dielectric structure 20 covering the word lines 14 and the silicon nitride layer 18. The dielectric structure 20 comprises a silicon oxide layer 22 and a silicon oxide layer 24, the silicon oxide layer 22 may include borophosphosilicate glass (BPSG), and the silicon oxide layer 24 may include TEOS. In addition, the dielectric structure 20 can be optionally formed of BPSG.

Figure 4B:
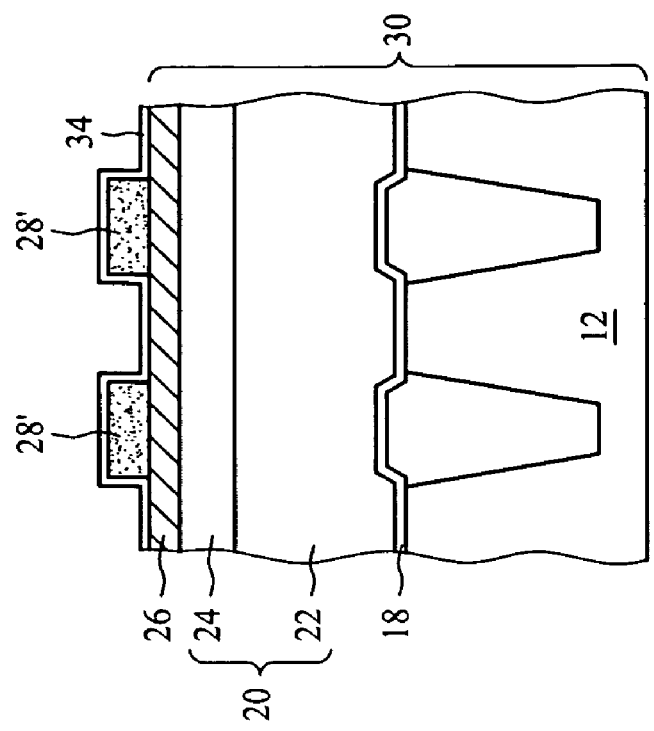
Figure 4A:
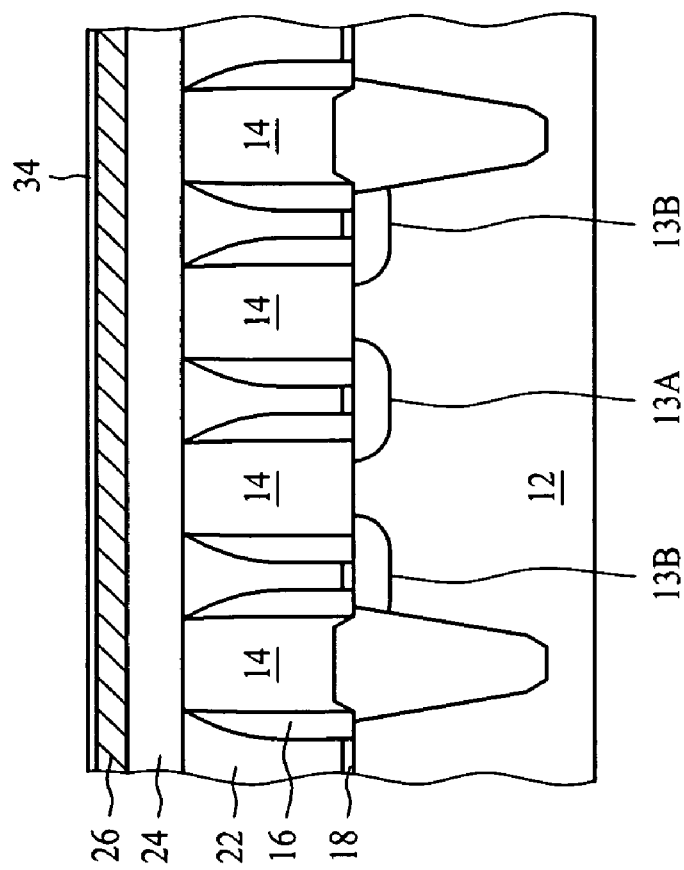

Referring to FIG. 4(a) and FIG. 4(b), these are cross-sectional diagrams along cross-sectional lines 1-1 and 2-2 in FIG. 3, respectively. An anisotropic dry etching process is performed to remove a portion of the dielectric layer 28 not covered by the line-shaped photoresist layer 32 to form a plurality of line-shaped dielectric patterns 28' on the silicon-containing layer 26. Subsequently, after the line-shaped photoresist layer 32 is removed, a deposition process is performed to form a silicon-containing layer such as a polysilicon layer 34 covering the line-shaped dielectric patterns 28' and the silicon-containing layer 26.

Figure 5:
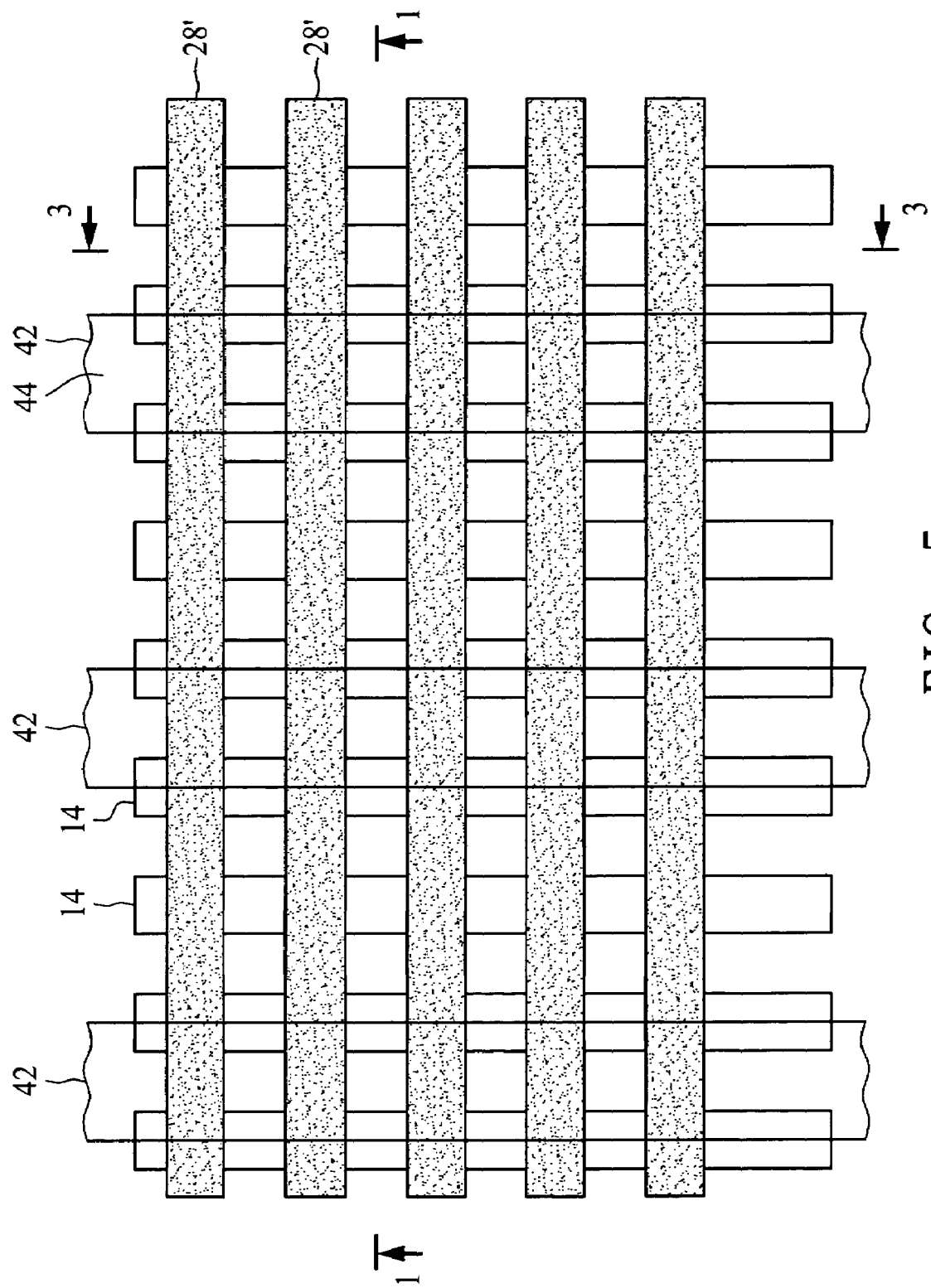
Figure 5B:
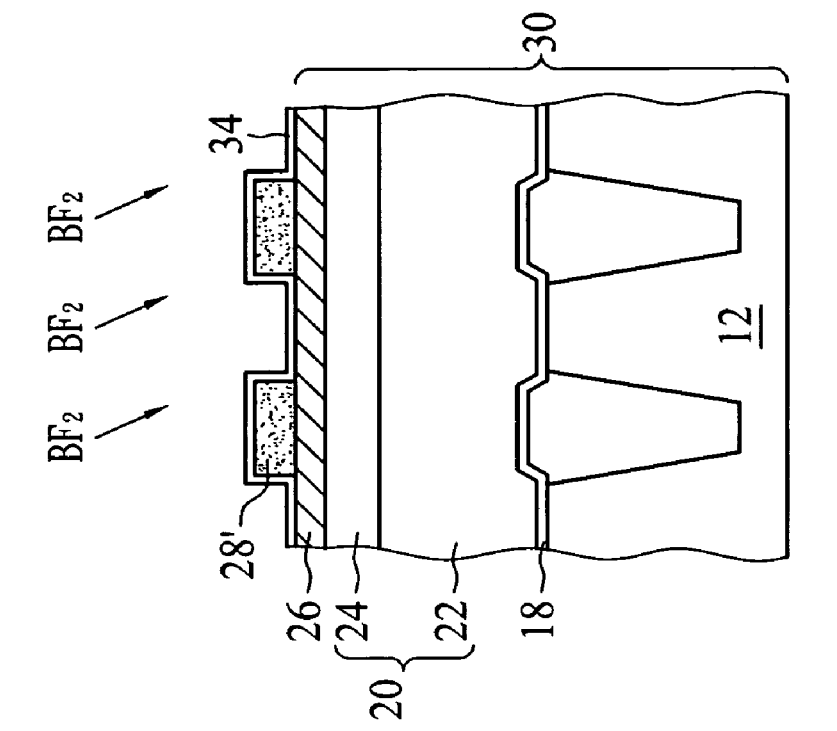
Figure 5A:
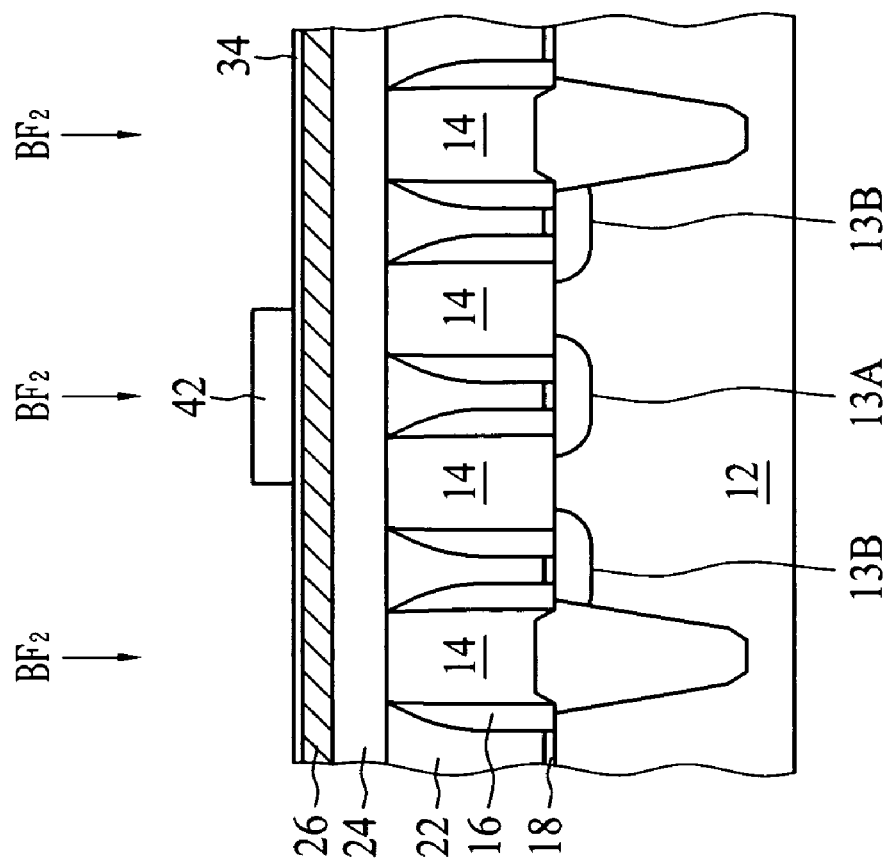

Referring to FIG. 5, FIG. 5(a) and FIG. 5(b), FIG. 5(a) and FIG. 5(b) are cross-sectional diagrams along cross-sectional lines 1-1 and 3-3 in FIG. 5, respectively. The line-shaped dielectric patterns 28' are substantially perpendicular to the word lines 14. A first implanting mask such as a photoresist layer 42 is formed to cover some of the line-shaped dielectric patterns 28' in a predetermined region 44 and expose the other line-shaped dielectric patterns 28' outside the predetermined region 44. Subsequently, a first tilt implanting process is performed to implant dopants such as boron fluoride (BF2) into the silicon-containing layer 34 on the line-shaped dielectric patterns 28' outside the predetermined region 44. In particular, the first tilt implanting process implants the dopants into a predetermined portion of the silicon-containing layer 34, specifically, the portion of the silicon-containing layer 34 on the left portion of the line-shaped dielectric patterns 28', to change its chemical properties such as the etching resistance ability, while the other portion of the silicon-containing layer 34 on the right portion of the line-shaped dielectric patterns 28' does not undergo dopants implanting and maintains its original chemical properties.

Figure 6:
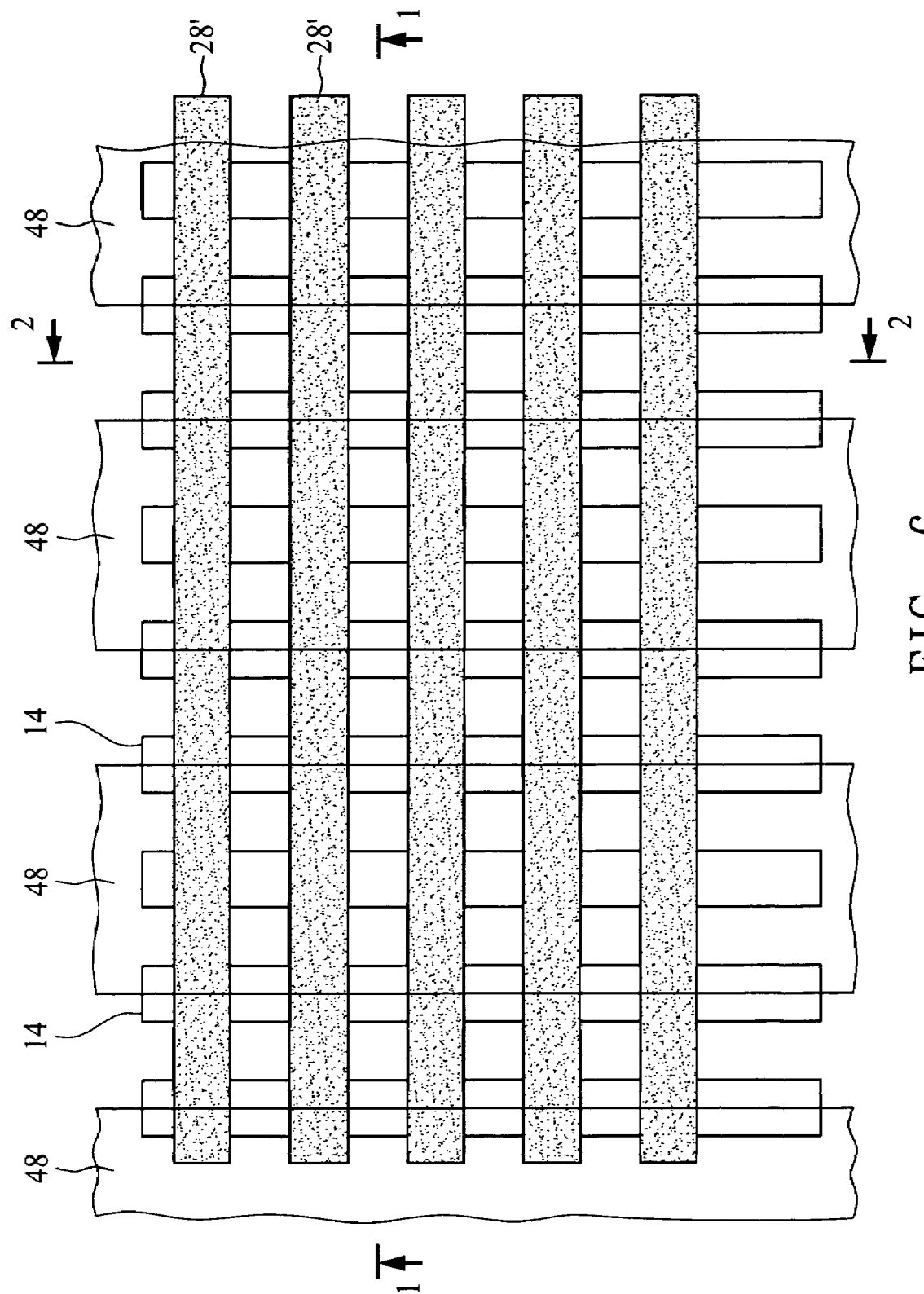

Referring to FIG. 6, FIG. 6(a) and FIG. 6(b), FIG. 6(a) and FIG. 6(b) are cross-sectional diagrams along cross-sectional lines 1-1 and 2-2 in FIG. 6, respectively. After the first implanting mask 42 is removed, a second implanting mask such as a photoresist layer 48, which is substantially complementary to the first implanting mask 42, is formed to cover the line-shaped dielectric patterns 28' outside the predetermined region 44 and expose the line-shaped dielectric patterns 28' inside the predetermined region 44. Subsequently, a second tilt implanting process is performed to implant dopants into the silicon-containing layer 34 on the line-shaped dielectric patterns 28' inside the predetermined region 44. Preferably, the implanting direction of the first tilt implanting process is opposite to the implanting direction of the second tilt implanting process. In particular, the second tilt implanting process implants the dopants into a predetermined portion of the silicon-containing layer 34, specifically, the portion of the silicon-containing layer 34 on the right portion of the line-shaped dielectric patterns 28', to change its chemical properties such as the etching resistance ability, while the other portion of the silicon-containing layer 34 on the left portion of the line-shaped dielectric patterns 28' does not undergo dopants implanting and maintains its original chemical properties.

Figure 7:
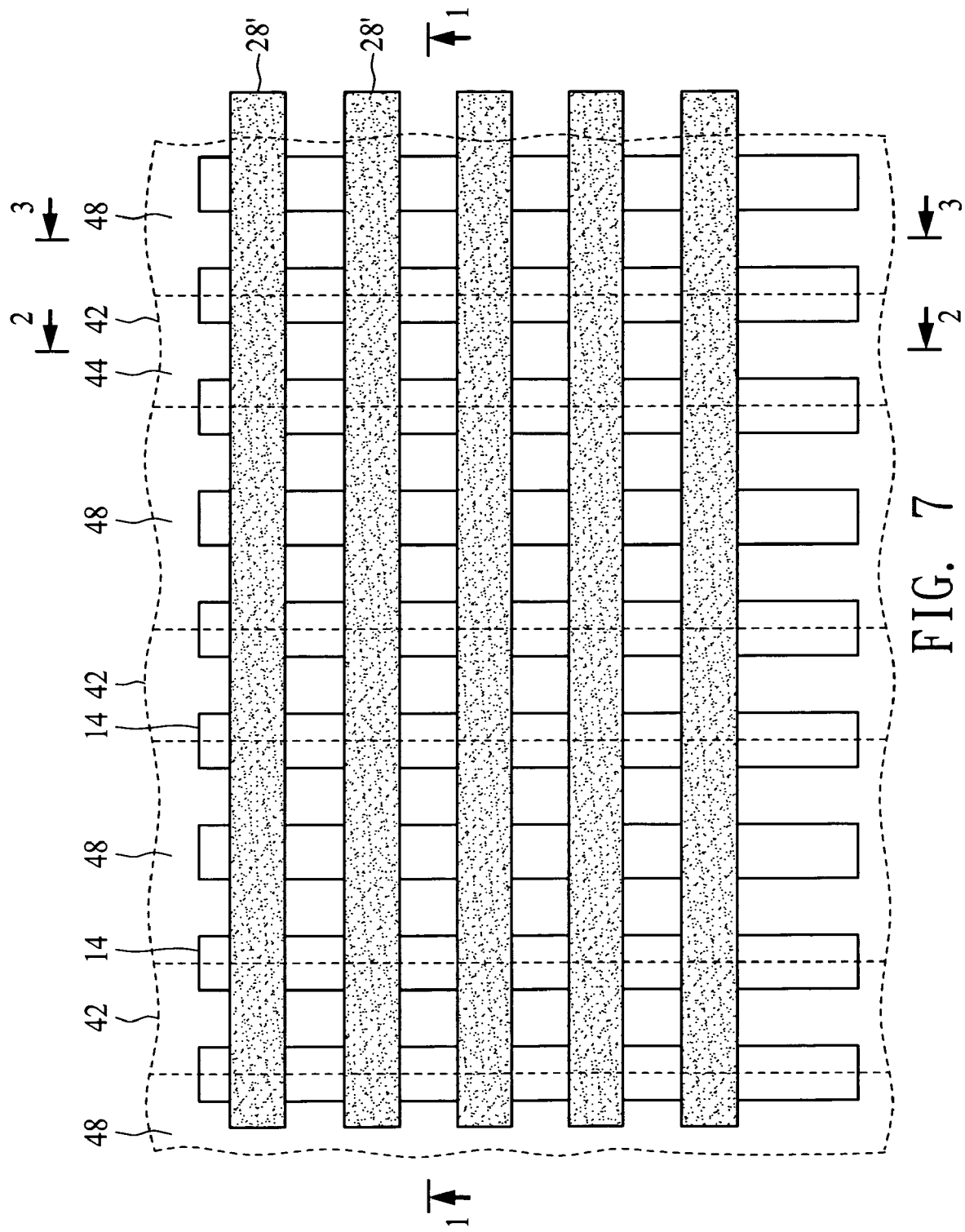
Figure 7A:
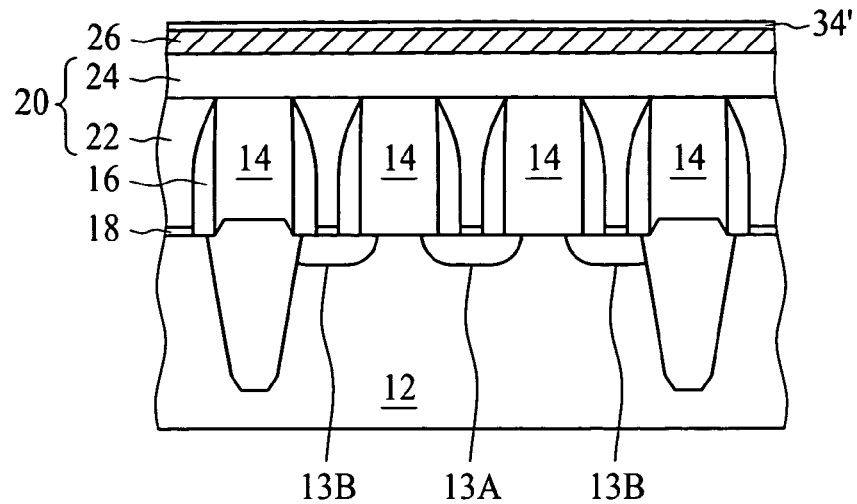
Figure 7B:
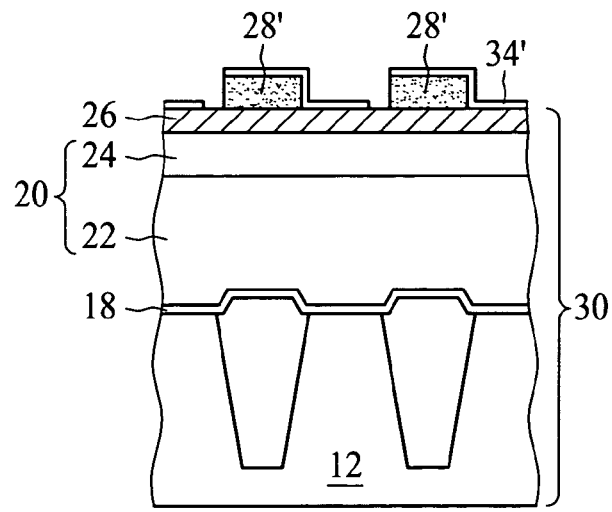
Figure 7C:
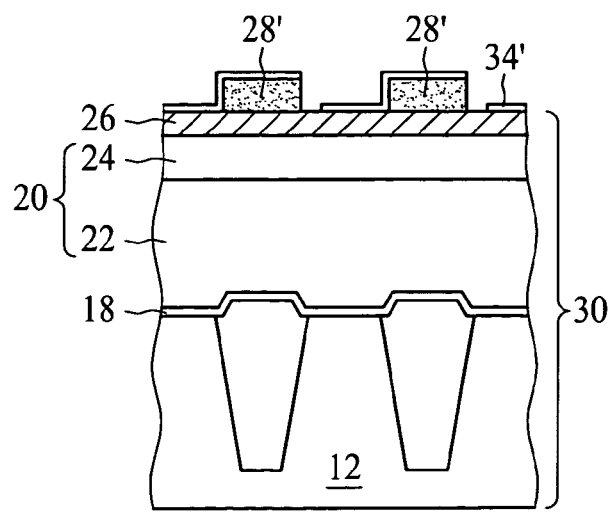

Referring to FIG. 7, FIG. 7(a), FIG. 7(b) and FIG. 7(c), FIG. 7(a), FIG. 7(b) and FIG. 7(c) are cross-sectional diagrams along cross-sectional lines 1-1, 2-2 and 3-3 in FIG. 7, respectively. After the second implanting mask 48 is removed, a wet etching process incorporating an etchant including ammonia is performed to remove a portion of the silicon-containing layer 34 other than the predetermined portion to form a first etching mask 34' such that the left sidewall of the line-shaped dielectric patterns 28' is exposed. In particular, the wet etching process removes a portion of the silicon-containing layer 34 on the left portion of the line-shaped dielectric patterns 28' inside the predetermined region 44, i.e., the portion of silicon-containing layer 34 not undergoing dopants implanting is removed by the wet etching process, as shown in FIG. 7(b). Similarly, the wet etching process also removes a portion of the silicon-containing layer 34 from the right portion of the line-shaped dielectric patterns 28' outside the predetermined region 44 such that the right sidewall of the line-shaped dielectric patterns 28' is exposed, as shown in FIG. 7(c).

Figure 8:
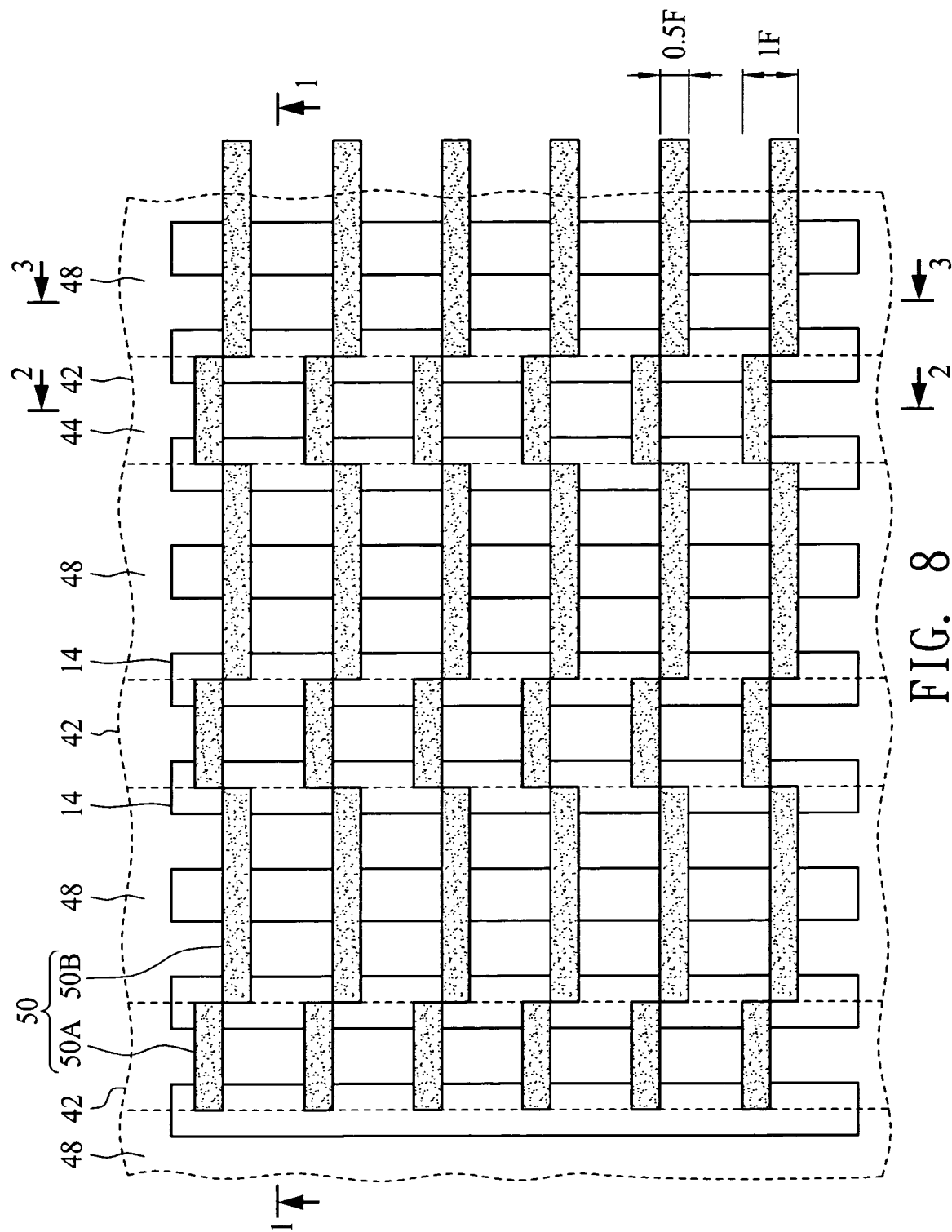
Figure 8A:
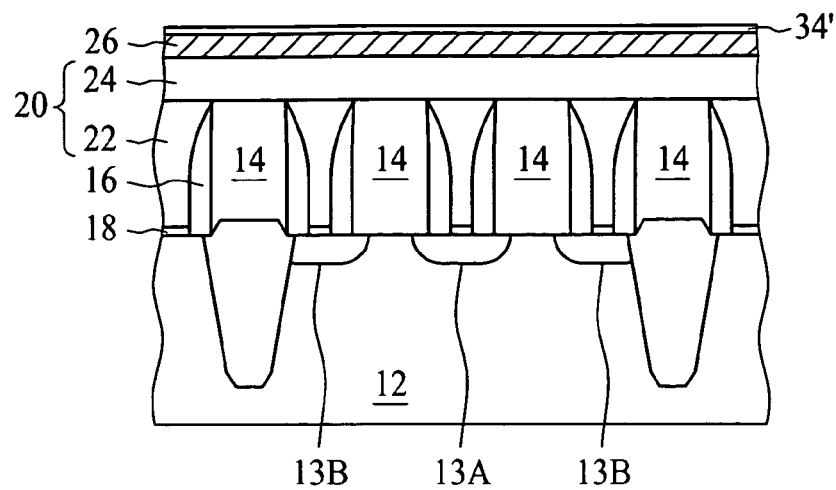
Figure 8B:
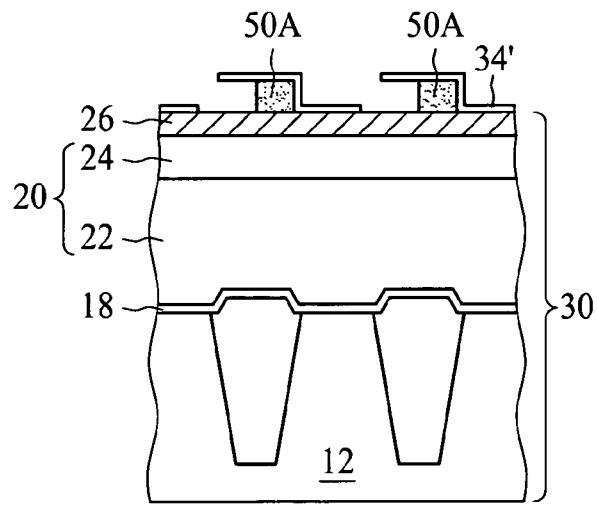
Figure 8C:
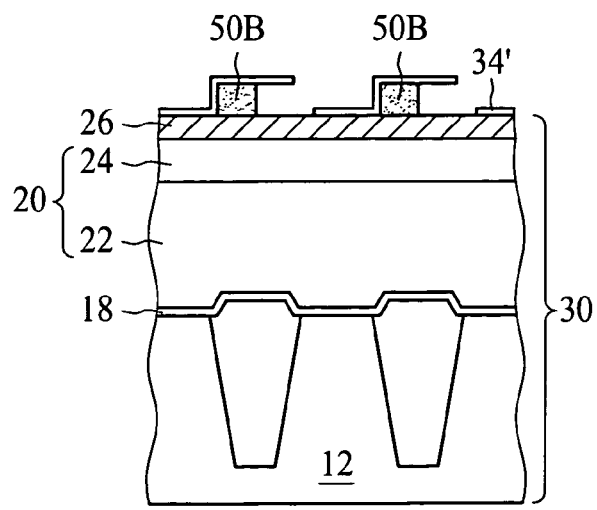

Referring to FIG. 8, FIG. 8(a), FIG. 8(b) and FIG. 8(c), FIG. 8(a), FIG. 8(b) and FIG. 8(c) are cross-sectional diagrams along cross-sectional lines 1-1, 2-2 and 3-3 in FIG. 8, respectively. Another wet etching process incorporating the buffered oxide etchant (BOE) is performed to remove a portion of the line-shaped dielectric patterns 28' not covered by the first etching mask 34' to form a second etching mask 50 including a plurality of first dielectric blocks 50A and second dielectric blocks 50B. The width of the dielectric block is 0.5 F, which is a half of the width (1 F) of the line-shaped pattern 28'.Wince the first etching mask 34' exposes the side wall of the line-shaped dielectric patterns 28', the buffered oxide etchant can etch the line-shaped dielectric patterns 28' via the exposed sidewall of the line-shaped dielectric patterns 28' to decrease the width of the line-shaped dielectric pattern 28'.

Preferably, the original width of the line-shaped dielectric patterns 28' is 1 F and the wet etching process decreases the width by 0.5 F, i.e., the width of the line-shaped dielectric patterns 28' after the wet etching process is 0.5 F. In particular, the line-shaped patterns 28' inside the predetermined region 44 are etched from a first side and the line-shaped patterns 28' outside the predetermined region 44 are etched from a second side opposite to the first side, and the first dielectric blocks 50A and the second dielectric blocks 50B are positioned in an interlaced manner.

Figure 9:
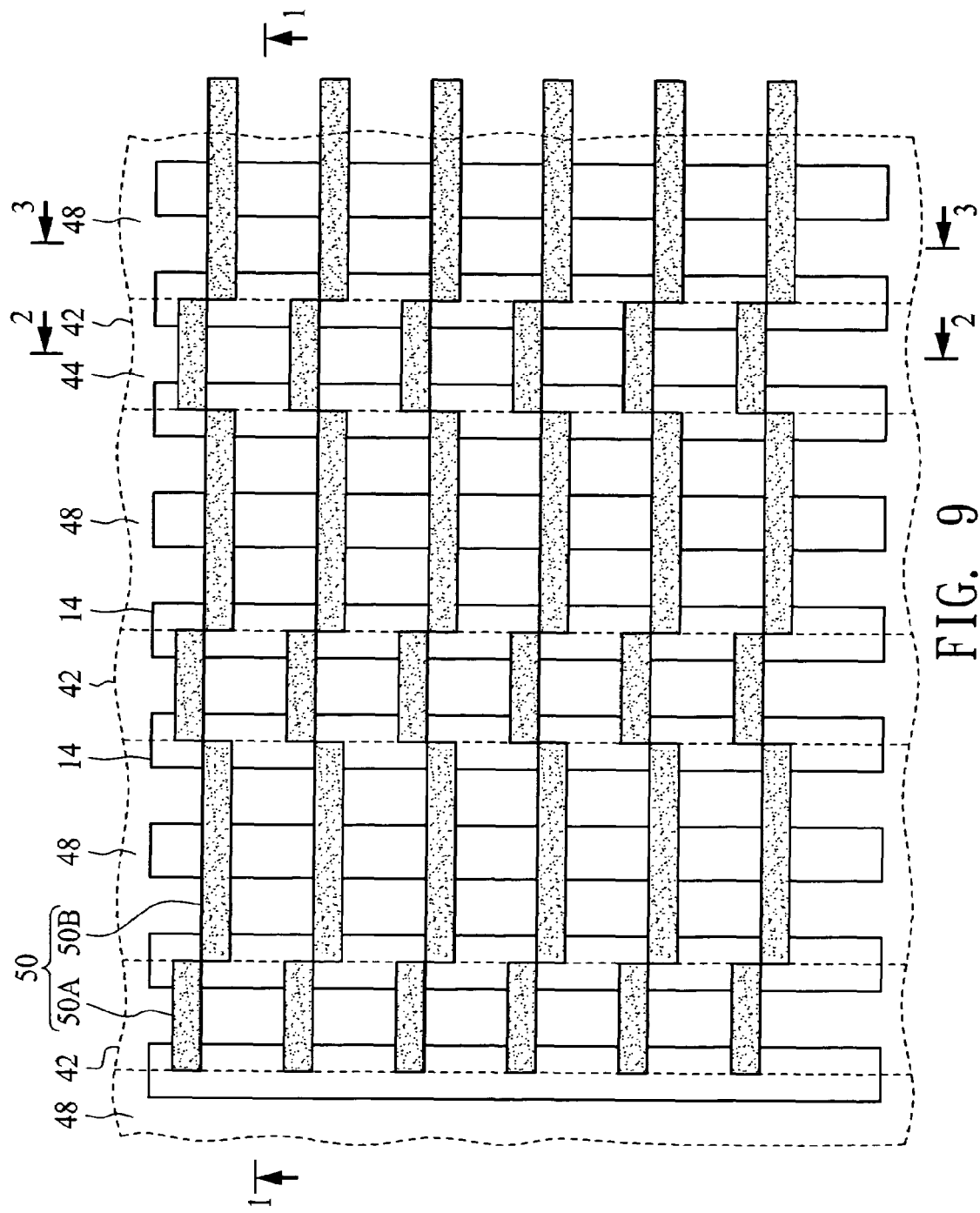
Figure 9A:
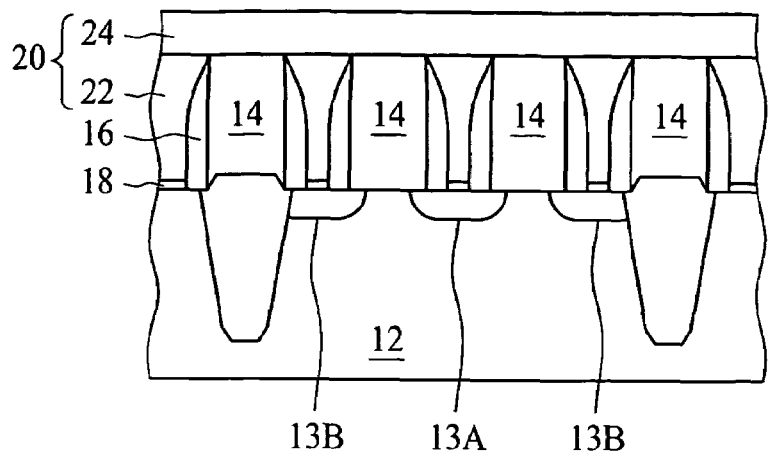
Figure 9B:
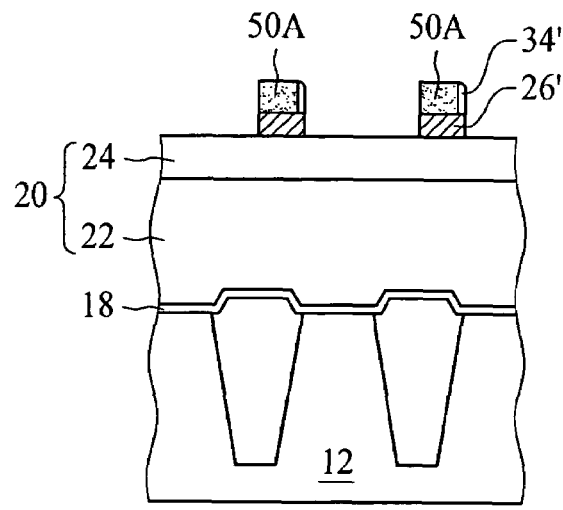
Figure 9C:
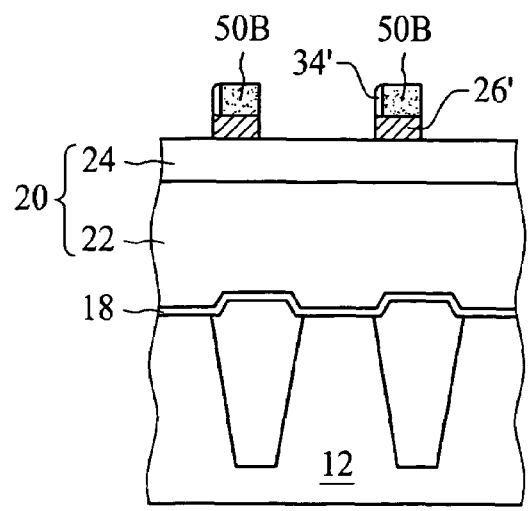

Referring to FIG. 9, FIG. 9(a), FIG. 9(b) and FIG. 9(c), FIG. 9(a), FIG. 9(b) and FIG. 9(c) are cross-sectional diagrams along cross-sectional lines 1-1, 2-2 and 3-3 in FIG. 9, respectively. An anisotropic dry etching process is performed incorporating the second etching mask 50 to remove the first etching mask 34' and remove a portion of the silicon-containing layer 26 to form a third etching mask 26'. Since the vertical thickness of the first etching mask 34' on the sidewalls of the first dielectric blocks 50A and the second dielectric blocks 50B is larger than that on the surface of the silicon-containing layer 26, a portion of the first etching mask 34' remains on the sidewalls of the first dielectric blocks 50A and the second dielectric blocks 50B as the anisotropic dry etching process completely removes the first etching mask 34' on the silicon-containing layer 26 and on the top surface of the first dielectric blocks 50A and the second dielectric blocks 50B. In addition, since the silicon-containing layer 26 and the first etching mask 34' may include the same material, i.e., polysilicon, and the dielectric structure 20 and the second etching mask 50 may include the same dielectric material, the anisotropic dry etching process can selectively remove the first etching mask 34' and a portion of the silicon-containing layer 26 not covered by the second etching mask 50 to form the third etching mask 26'.

Figure 10:
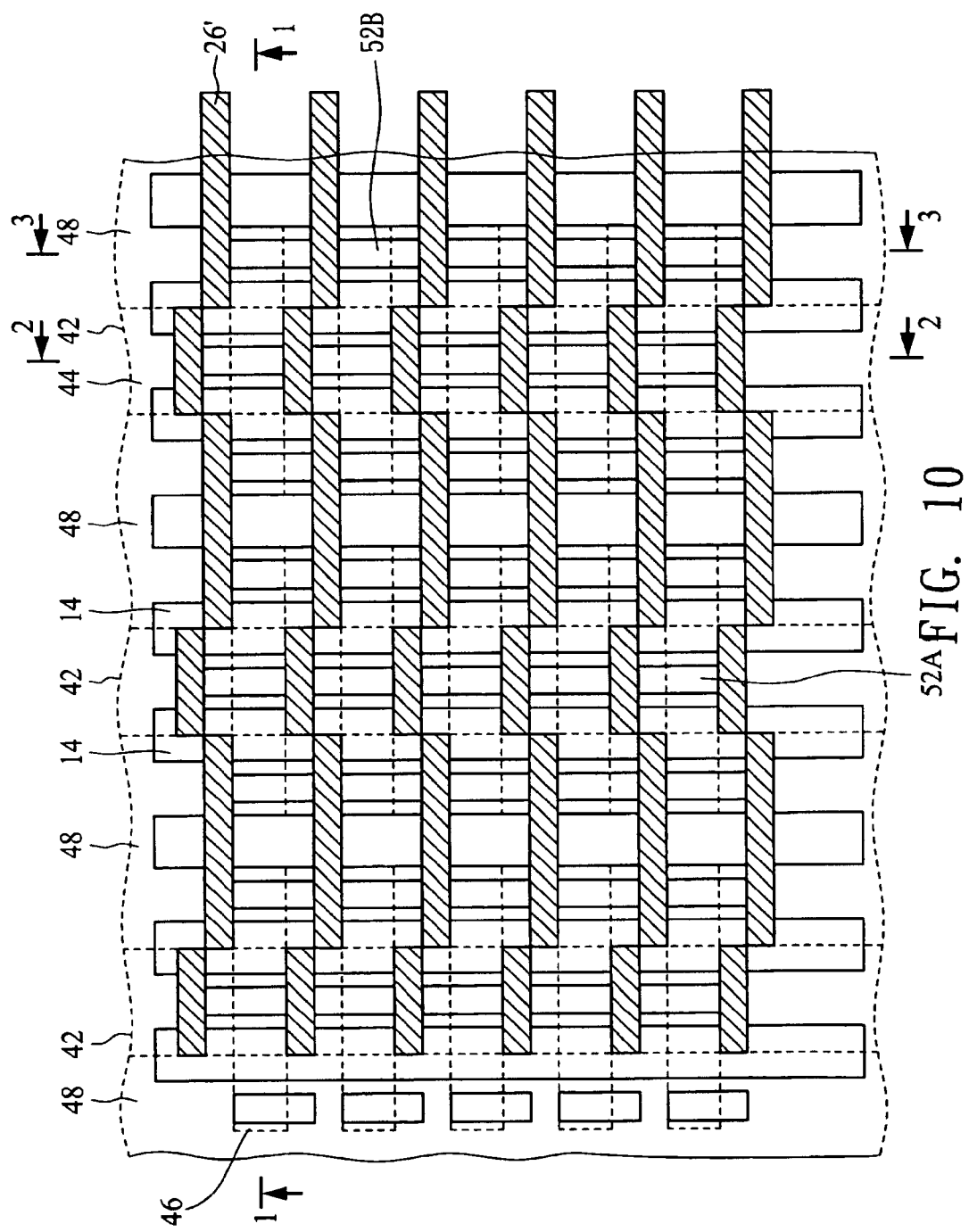
Figure 10A:
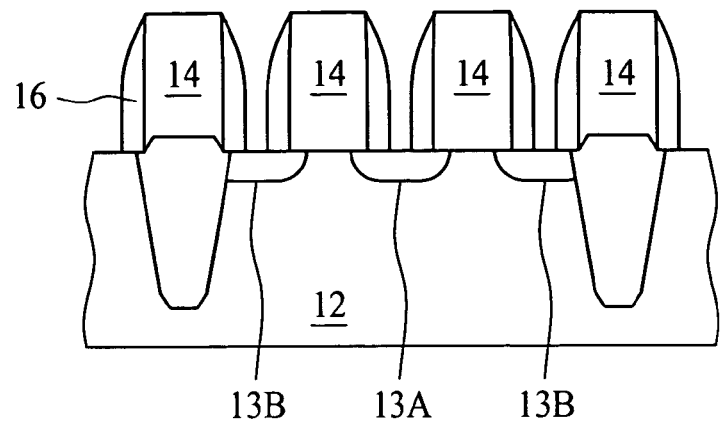
Figure 10B:
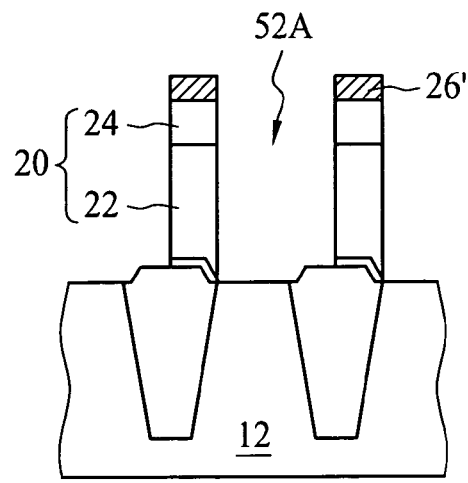
Figure 10C:
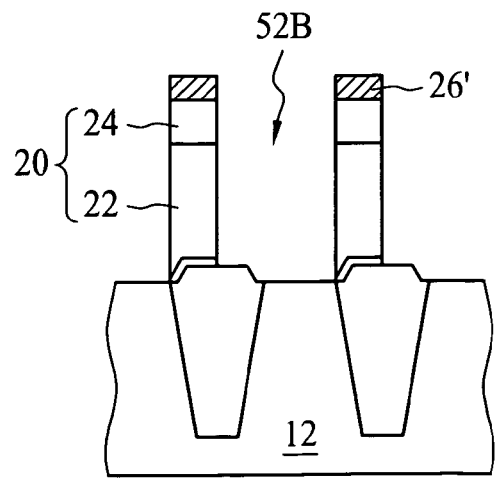

Referring to FIG. 10, FIG. 10(a), FIG. 10(b) and FIG. 10(c), FIG. 10(a), FIG. 10(b) and FIG. 10(c) are cross-sectional diagrams along cross-sectional lines 1-1, 2-2 and 3-3 in FIG. 10, respectively. Another anisotropic etching process is performed to completely remove the first dielectric blocks 50A and the second dielectric blocks 50B and remove a portion of the dielectric structure 20 not covered by the third etching mask 26' to form a plurality of first openings 52A and second openings 52B in the dielectric structure 20. In particular, the first openings 52A are positioned between the first dielectric blocks 50A and the second openings 52B are positioned between the second dielectric blocks 50B, and the first openings 52A and the second openings 52B extend to opposite sides of an active area 46. The anisotropic dry etching process may optionally remove a portion of the silicon nitride layer 18 to expose the doped regions 13A and 13B in the semiconductor substrate 12. If the positions or sizes of the first openings 52A and second openings 52B after the anisotropic dry etching process are not as desired, the present invention allows the restarting of the above-mentioned processes by stripping the dielectric structure 20.

Figure 11:
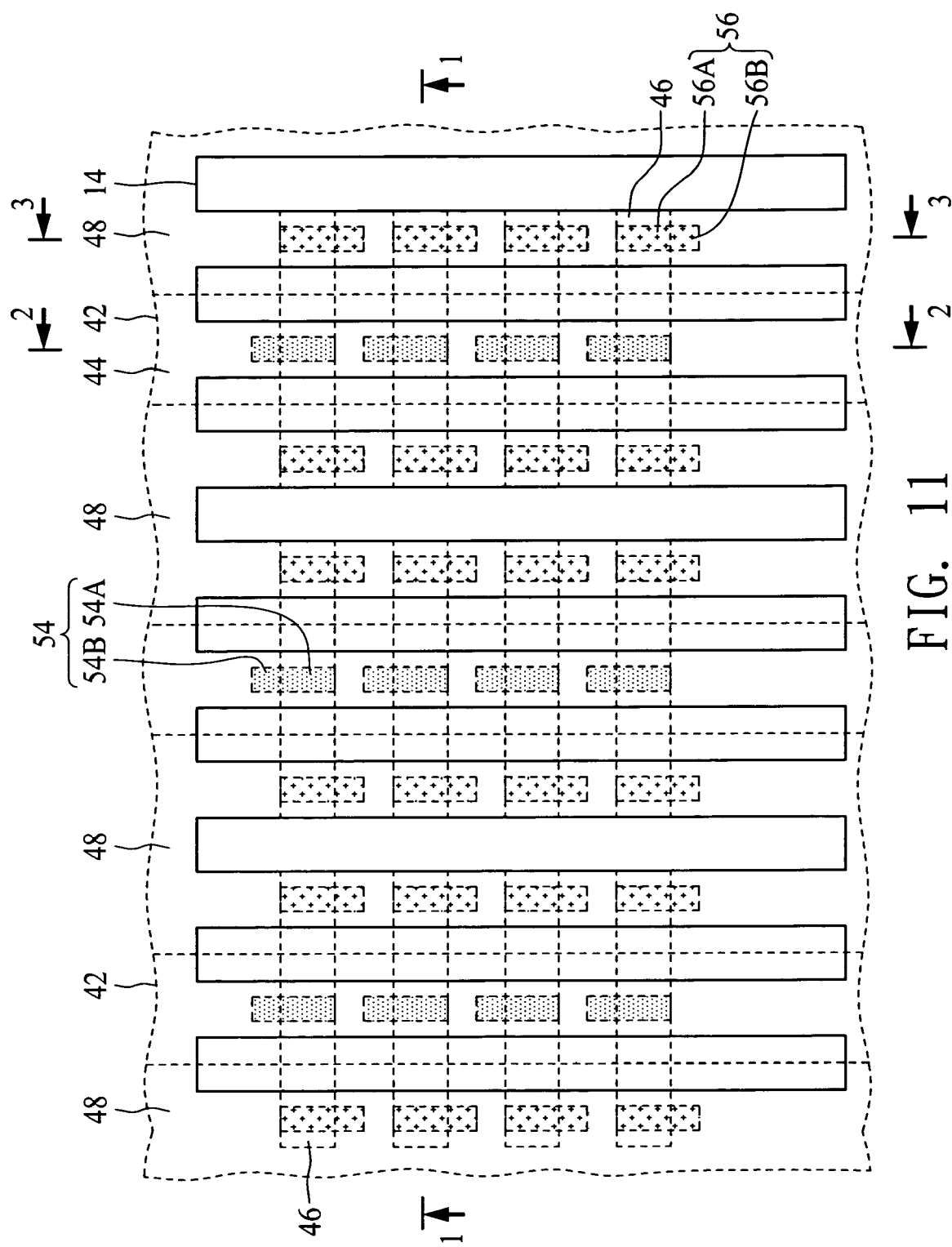
Figure 11A:
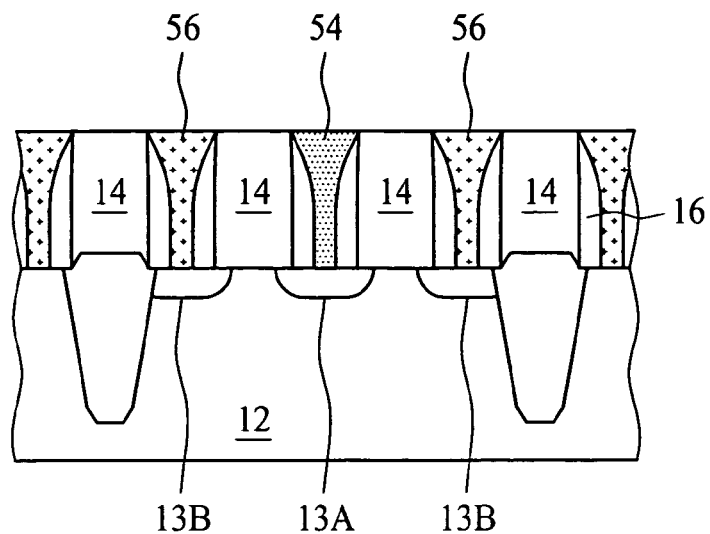
Figure 11B:
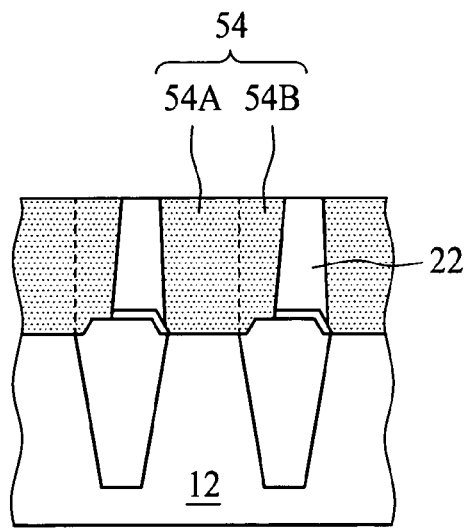
Figure 11C:
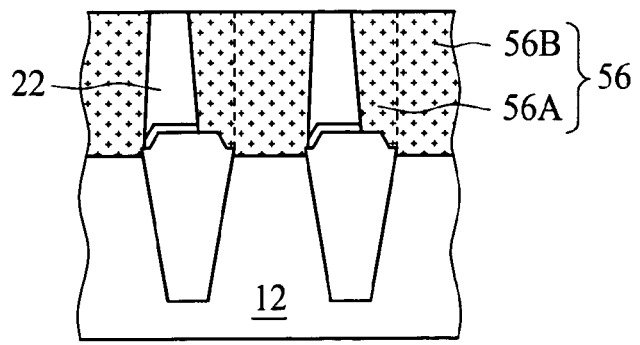

Referring to FIG. 11, FIG. 11(a), FIG. 11(b) and FIG. 11(c), FIG. 11(a), FIG. 11(b) and FIG. 11(c) are cross-sectional diagrams along cross-sectional lines 1-1, 2-2 and 3-3 in FIG. 11, respectively. A deposition process is performed to form a conductive layer such as a doped polysilicon layer, and a planarization process such as a chemical mechanical polishing process or an etch back process is then performed to remove a portion of the conductive layer to form a plurality of first conductive plugs 54 in the first openings 52A inside the predetermined region 44 and a plurality of second conductive plugs 56 in the second openings 52B outside the predetermined region 44. In particular, the planarization process also removes the dielectric layer 24 and the third etching mask 26' above the dielectric layer 22.

The first conductive plug 54 includes a first conductive block 54A positioned in the active area 46 and a second conductive block 54B positioned at a first side of the active area 46. The second conductive plug 56 includes a third conductive block 56A positioned in the active area 46 and a fourth conductive block 56B positioned at a second side of the active area 46. Preferably, the width of the first conductive block 54A is substantially twice as large as the width of second conductive block 54B, the width of the third conductive block 56A is substantially twice as large as the width of fourth conductive block 56B, and the first side and the second side of the active area 46 are opposite sides of the active area 46.

Figure 12:
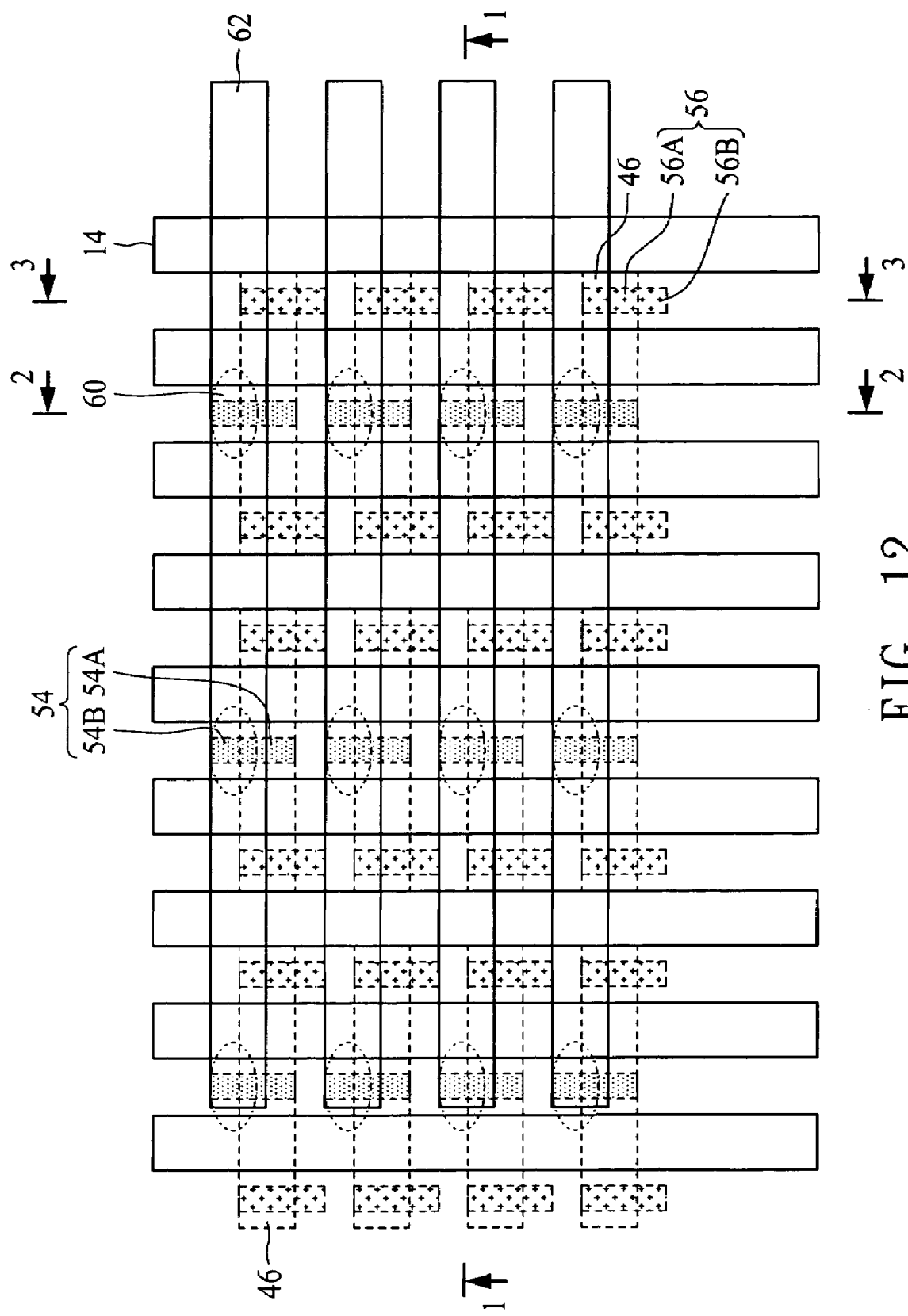
Figure 12A:
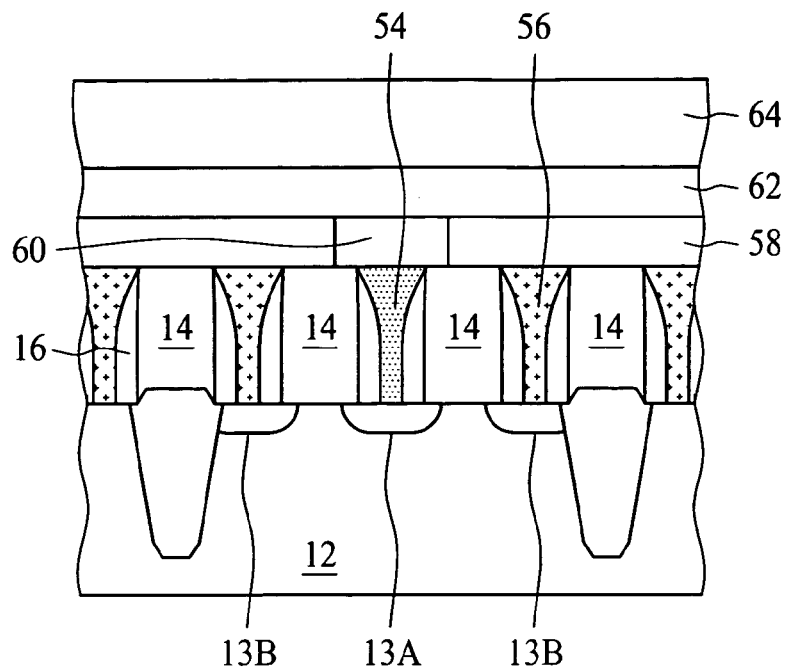
Figure 12B:
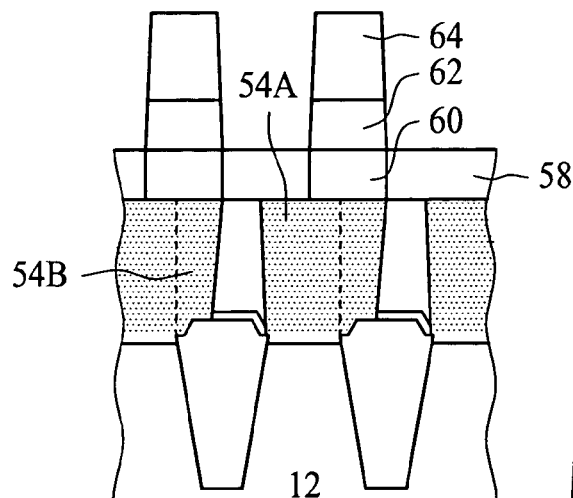
Figure 12C:
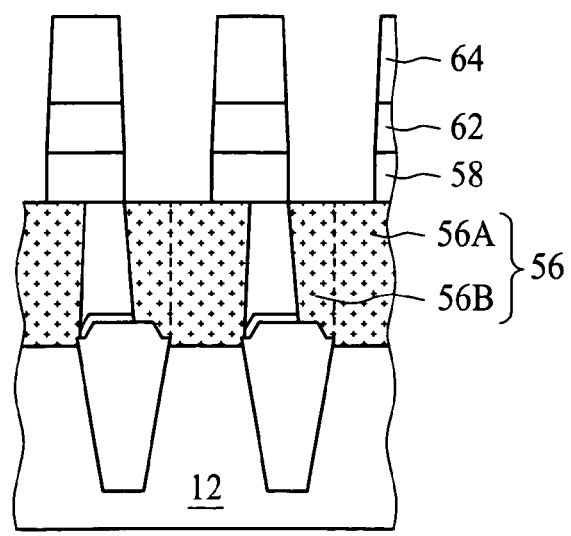

Referring to FIG. 12, FIG. 12(a), FIG. 12(b) and FIG. 12(c), FIG. 12(a), FIG. 12(b) and FIG. 12(c) are cross-sectional diagrams along cross-sectional lines 1-1, 2-2 and 3-3 in FIG. 12, respectively. A dielectric layer 58 is formed to cover the first conductive plug 54 and the second conductive plug 56, and a bit line contact plug 60 connecting the first conductive plug 54 is then formed in the dielectric layer 58. Subsequently, a conductive layer such as a tungsten layer is formed by a deposition process on the dielectric layer 58 and a silicon nitride mask 64 is then formed on the conductive layer. A dry etching process is performed to remove a portion of the conductive layer not covered by the silicon nitride mask 64 to form a bit line 62 connecting the bit line contact plug 60. To achieve the electrical connection between the bit line 62 and the doped region 13A, the bit line contact plug 60 can optionally connect either the first conductive block 54A or the second conductive block 54B of the first conductive plug 54. Therefore the lithographic process for patterning the size and the position of the bit line contact plug 60 possesses a wider process window. Preferably, the bit line contact plug 60 connects the second conductive block 54B of the first conductive plug 54.

Figure 13:
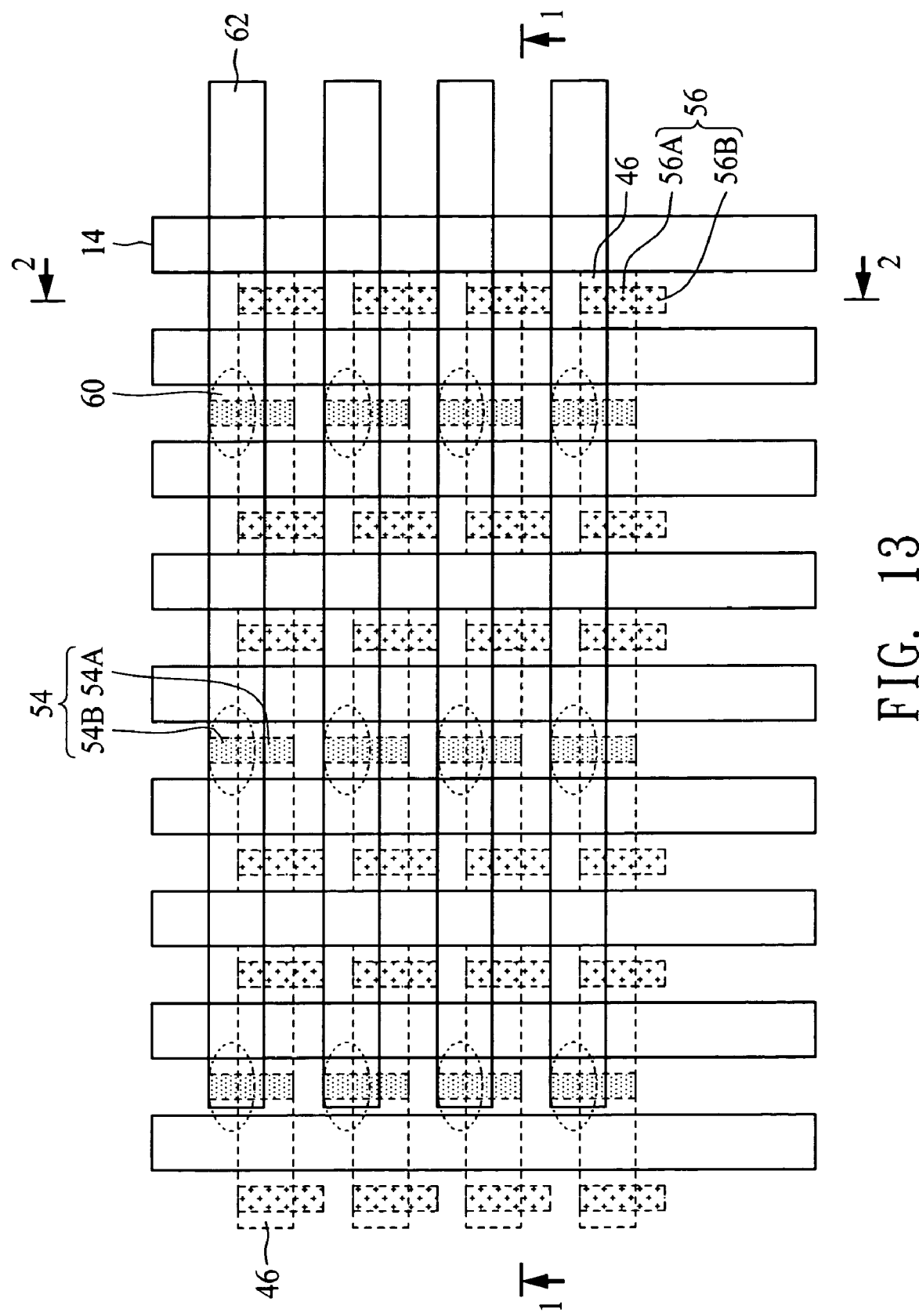
Figure 13A:
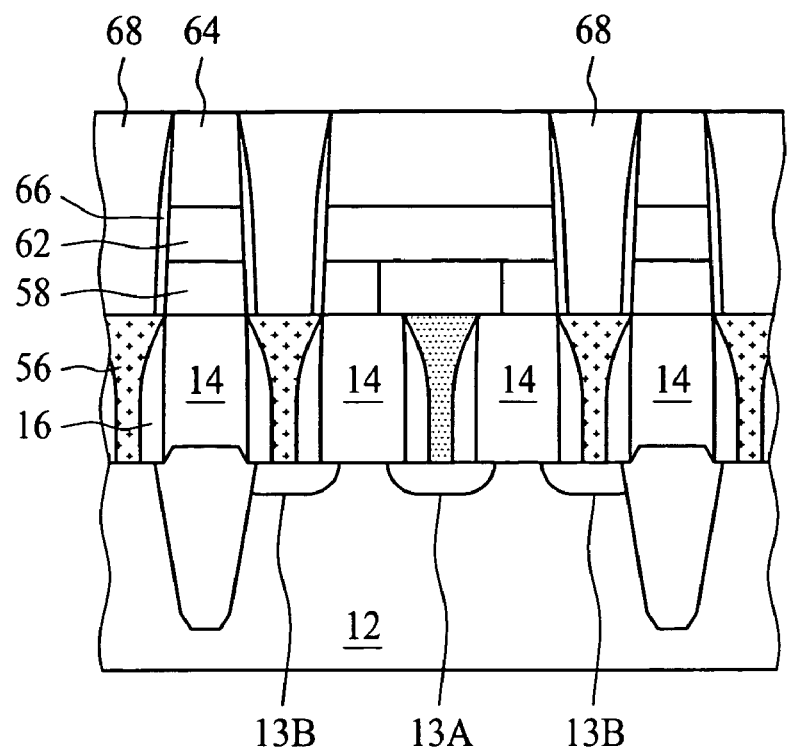
Figure 13B:
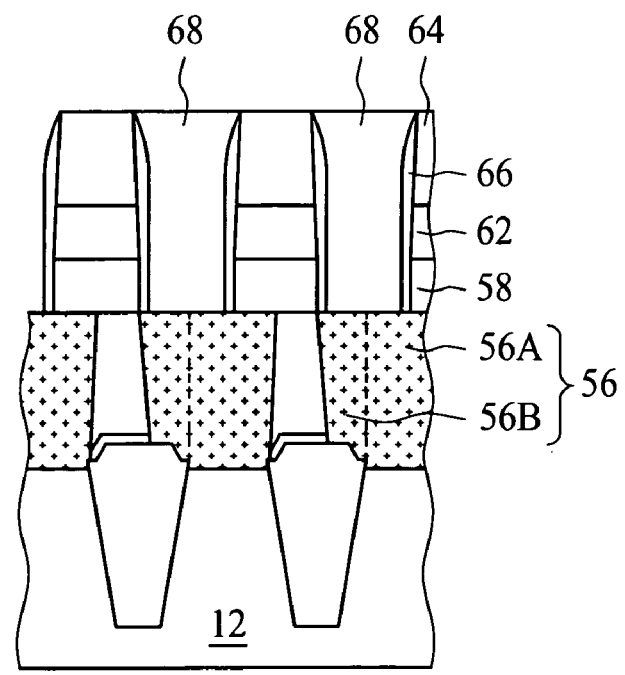

Referring to FIG. 13, FIG. 13(a) and FIG. 13(b), FIG. 13(a) and FIG. 13(b) are cross-sectional diagrams along cross-sectional lines 1-1 and 2-2 in FIG. 13, respectively. A silicon nitride spacer 66 is formed to electrically isolate the bit line 62, and a high density chemical vapor phase deposition process is then performed to form a silicon oxide layer 68 filling the gaps between the bit lines 62. Subsequently, a planarization process is performed to remove a portion of silicon oxide layer 68 from the silicon nitride mask 64.

Figure 14:
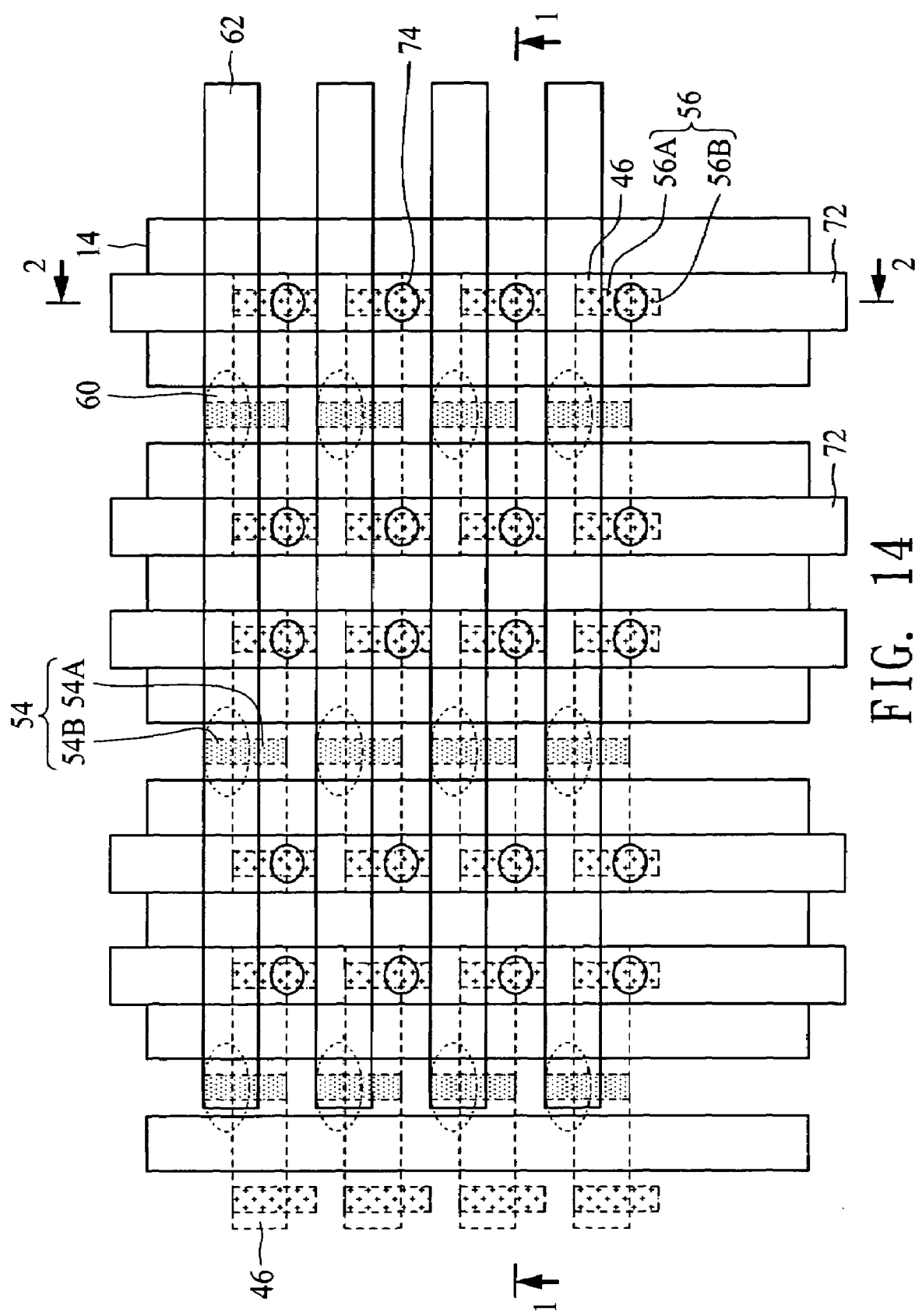
Figure 14A:
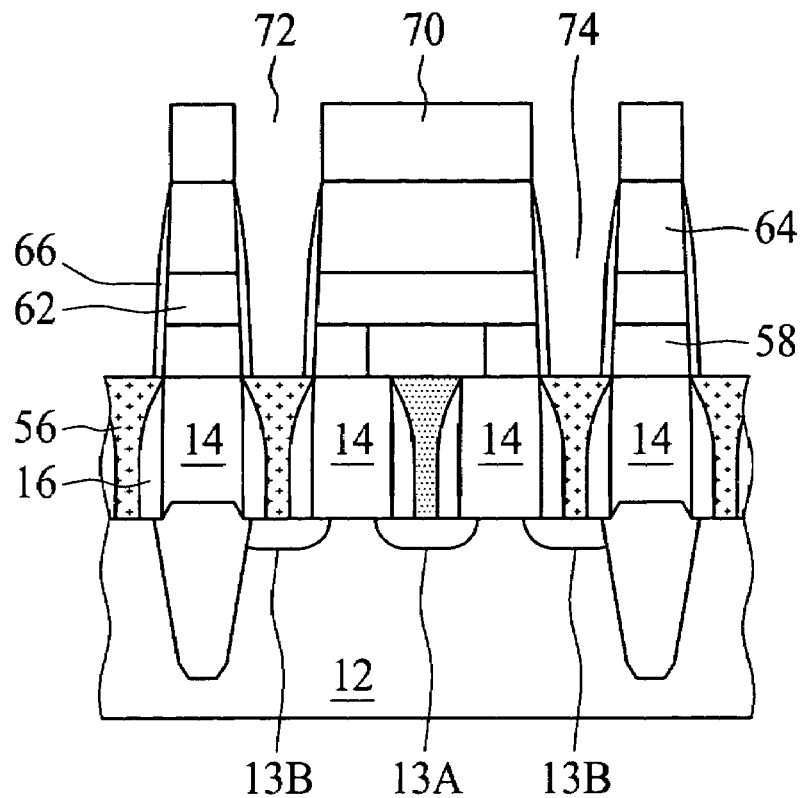
Figure 14B:
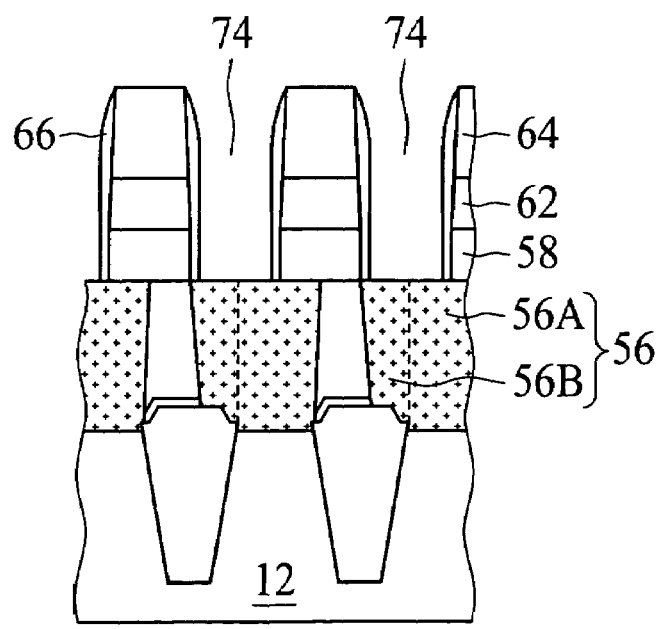

Referring to FIG. 14, FIG. 14(a) and FIG. 14(b), FIG. 14(a) and FIG. 14(b) are cross-sectional diagrams along cross-sectional lines 1-1 and 2-2 in FIG. 14, respectively. A photoresist layer 70 having a plurality of line-shaped openings 72 is formed on the planarized surface, and the line-shaped opening 72 exposes a portion of the silicon oxide layer 68. Subsequently, incorporating the photoresist layer 70 and the silicon nitride spacer 66 as the etching mask, a self-aligned dry etching process is performed to remove a portion of the silicon oxide layer 68 under the line-shaped openings 72 to form a plurality of contact holes 74 exposing the fourth conductive block 56B of the second conductive plug 56.

Figure 15:
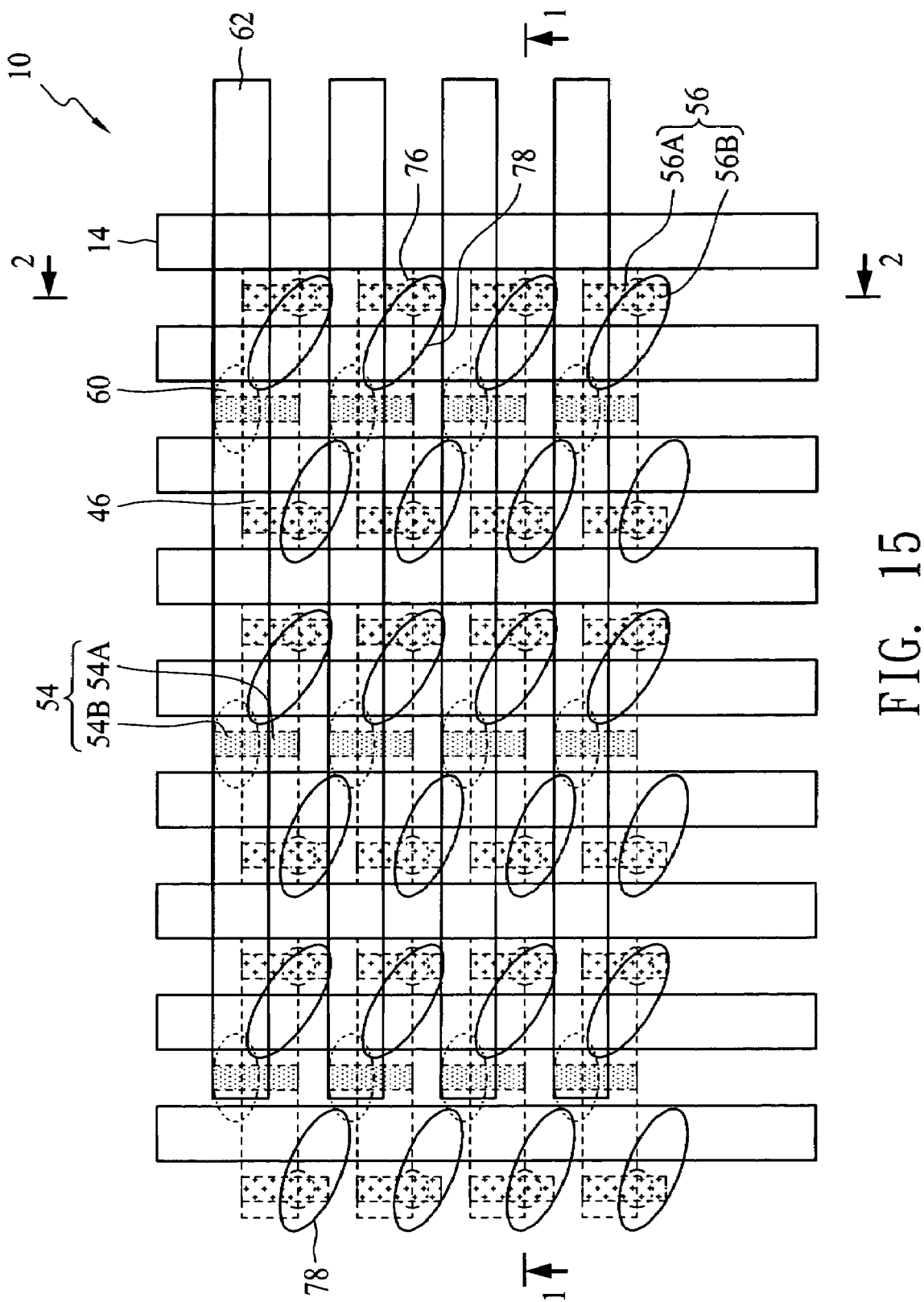
Figure 15A:
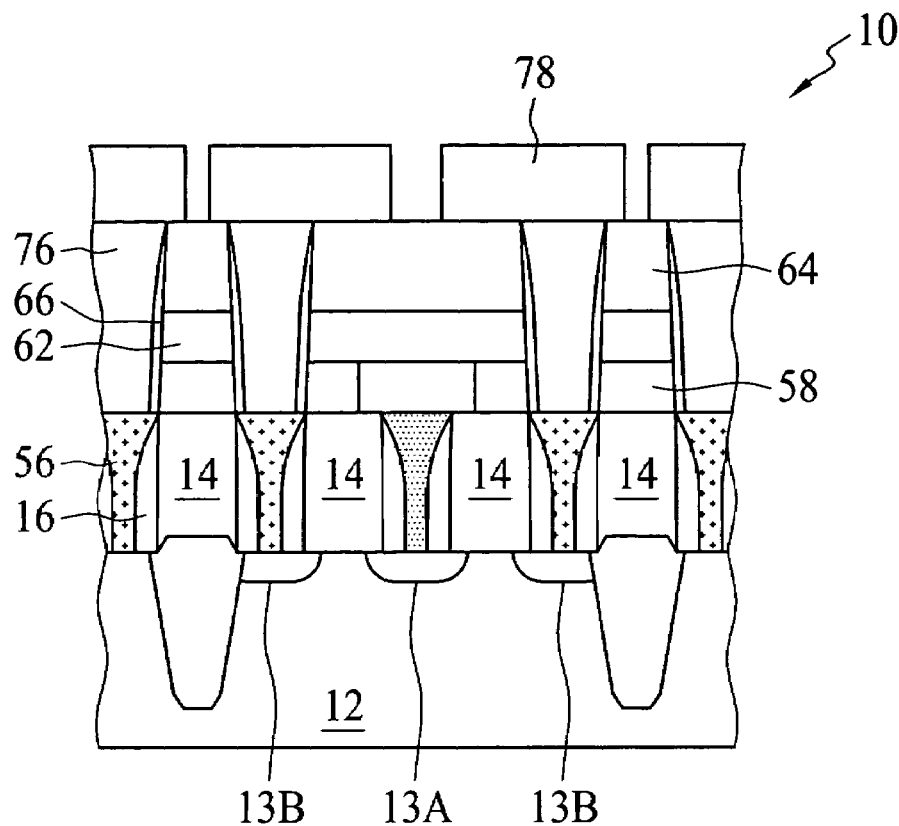
Figure 15B:
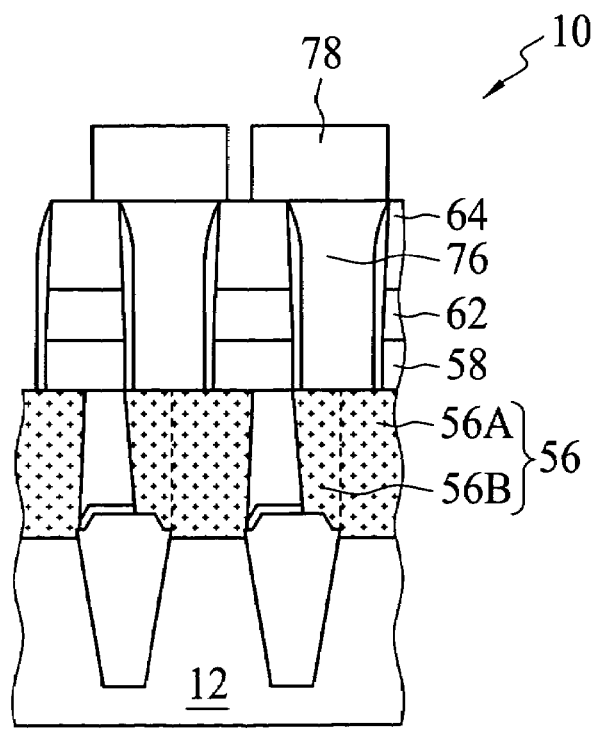

Referring to FIG. 15, FIG. 15(a) and FIG. 15(b), FIG. 15(a) and FIG. 15(b) are cross-sectional diagrams along cross-sectional lines 1-1 and 2-2 in FIG. 15, respectively. A silicon nitride deposition process and a dry etching process are performed after the photoresist layer 70 is removed to increase the thickness of the silicon nitride spacer 66, and a deposition process is then performed to form a conductive layer filling the contact holes 74. Subsequently, a planarization process is performed to remove a portion of the conductive layer to form a capacitor contact plug 76 connecting the fourth conductive block 56B of the second conductive plug 56 outside the predetermined region 44, and a plurality of capacitors 78 is then formed on the dielectric layer 64 to complete the memory structure 10. The capacitors 78 are positioned above the bit line 62, and electrically connect the fourth conductive block 56B of the second conductive plug 56 via the capacitor contact plug 46. In particular, the two capacitors 78 connecting to the capacitor contact plugs 76 in the same active area 46 are positioned at the same side of the active area 46.

The conventional memory structure 100 needs the double exposure technique and the advanced lithographic technique to define the size and the position of the capacitor contact plug 110, i.e., the contact hole, as the integrated circuit technique proceeds into the nanometer generation (F is less than 100 nanometers). In comparison, the present invention uses the etching process to extend the width of the opening 52A and 52B from opposite sides of the active area 46, and the width of the first conductive plugs 54 in the first openings 52A and the second conductive plugs 56 in the second openings 52B extend to opposite sides of the active area 46 such that the use of the double exposure technique and the advanced lithographic technique such as liquid immersion lithographic technique can be postponed to the next generation.

In particular, the bit line 62 and the active area 46 are simple line-shaped patterns, which does not require the use of the double exposure technique and advanced lithographic techniques such as the liquid immersion lithographic technique. In addition, the present invention prepares the contact holes 74 incorporating the mask 70 with simple line-shaped openings 72 and incorporating the self-aligned dry etching technique, and the use of the advanced lithographic technique can be postponed.

The above-described embodiments of the present invention are intended to be illustrative only. Numerous alternative embodiments may be devised by those skilled in the art without departing from the scope of the following claims.

What is claimed is:

1. A method for preparing a memory structure, comprising the steps of:
   forming a plurality of dielectric line-shaped patterns on a substrate having a dielectric structure with word lines, the dielectric line-shaped patterns being perpendicular to the word lines;
   forming a first silicon-containing layer covering the dielectric line-shaped patterns;
   forming a first implanting mask covering a portion of the first silicon-containing layer in a predetermined region;
   performing a first tilt implanting process to implant dopants into the first silicon-containing layer outside the predetermined region;
   forming a second implanting mask exposing a portion of the first silicon-containing layer in the predetermined region;
   performing a second tilt implanting process to implant dopants into the first silicon-containing layer inside the predetermined region, wherein the implanting direction of the first implanting process is different from the implanting direction of the second implanting process;
   removing a portion of the first silicon-containing layer other than a predetermined portion to form a first etching mask exposing a portion of the line-shaped pattern;
   incorporating the first etching mask to remove a portion of the dielectric line-shaped patterns so as to form a second etching mask having a plurality of dielectric blocks, the width of the dielectric block being a half of the width of the dielectric line-shaped pattern;
   removing a portion of the dielectric structure not covered by the second etching mask to form a plurality of openings in the dielectric structure; and
   forming conductive plugs in the openings.

2. The method for preparing a memory structure of claim 1, wherein the portion of the first silicon-containing layer is removed from a sidewall of the dielectric line-shaped patterns in the step of removing a portion of the first silicon-containing layer.

3. The method for preparing a memory structure of claim 1, wherein, the first silicon-containing layer includes polysilicon, and the dopants include boron fluoride.

4. The method for preparing a memory structure of claim 3, wherein the portion of the first silicon-containing layer other than the predetermined portion is removed by a wet etching process incorporating an etchant including ammonia.

5. The method for preparing a memory structure of claim 1, wherein the implanting direction of the first tilt implanting process is opposite to the implanting direction of the second tile implanting process.

6. The method for preparing a memory structure of claim 1, further comprising the steps of forming a plurality of bit line contact plugs connecting the conductive plugs inside the predetermined region and forming a plurality of capacitor contact plugs connecting the conductive plugs outside the predetermined region.

7. The method for preparing a memory structure of claim 1, wherein the portion of the dielectric line-shaped patterns is removed to form the second etching mask by a wet etching process.

8. The method for preparing a memory structure of claim 7, wherein the dielectric line-shaped patterns include dielectric material and the wet etching process uses a buffered oxide etchant to remove a portion of the dielectric line-shaped patterns.

9. The method for preparing a memory structure of claim 7, wherein the wet etching process decreases the width of the dielectric line-shaped patterns.

10. The method for preparing a memory structure of claim 9, wherein the dielectric line-shaped patterns inside the predetermined region are etched from a first side and the dielectric line-shaped patterns outside the predetermined region are etched from a second side different from the first side.

11. The method for preparing a memory structure of claim 10, wherein the first side is opposite to the second side.

12. The method for preparing a memory structure of claim 1, further comprising a step of forming a second silicon-containing layer on the dielectric structure, and the dielectric line-shaped patterns being formed on the second silicon-containing layer.

13. The method for preparing a memory structure of claim 12, wherein the step of removing a portion of the dielectric structure not covered by the second etching mask to form a plurality of openings in the dielectric structure comprises:
   removing a portion of the second silicon-containing layer not covered by the second etching mask to form a third etching mask; and
   removing a portion of the dielectric structure not covered by the third etching mask to form the openings.

14. The method for preparing a memory structure of claim 13, wherein the second etching mask includes a plurality of first blocks and a plurality of second blocks, and the first blocks and the second blocks are positioned in an interlaced manner.

15. The method for preparing a memory structure of claim 14, wherein the openings include:
   a plurality of first openings positioned between the first blocks; and
   a plurality of second openings positioned between the second blocks.

16. The method for preparing a memory structure of claim 15, wherein the first openings and the second openings extend to opposite sides of an active area.

* * * * *